United States Patent
Breymesser et al.

(10) Patent No.: US 9,558,948 B1
(45) Date of Patent: Jan. 31, 2017

(54) LASER THERMAL ANNEALING OF DEEP DOPED REGION USING STRUCTURED ANTIREFLECTIVE COATING

(71) Applicant: Infineon Technologies Austria AG, Villach (AT)

(72) Inventors: Alexander Breymesser, Villach (AT); Holger Schulze, Villach (AT); Werner Schustereder, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/171,483

(22) Filed: Jun. 2, 2016

(51) Int. Cl.
*H01L 21/268* (2006.01)
*H01L 21/265* (2006.01)
*H01L 21/324* (2006.01)
*H01L 21/428* (2006.01)
*H01L 21/02* (2006.01)

(52) U.S. Cl.
CPC ....... *H01L 21/265* (2013.01); *H01L 21/02354* (2013.01); *H01L 21/02683* (2013.01); *H01L 21/324* (2013.01); *H01L 21/428* (2013.01)

(58) Field of Classification Search
CPC ............... H01L 21/02354; H01L 21/02683; H01L 21/40; H01L 21/42; H01L 21/425; H01L 21/426; H01L 21/428
See application file for complete search history.

(56) References Cited

U.S. PATENT DOCUMENTS 7,842,590 B2    11/2010   Gutt et al.
2008/0308904 A1*   12/2008   Chidambaram .. H01L 21/26506
                                                    257/607

OTHER PUBLICATIONS

Kim, H J. et al., "New excimer-laser-crystallization method for producing large-grained and grain boundary-location-controlled Si films for thin film transistors", Appl. Phys. Lett. 68 (11), Mar. 11, 1996, pp. 1513-1515.

Marmorstein, Aaron M., "Investigation of Parameters Affecting Polysilicon Characteristics for Laser Annealed Polysilicon Thin Film Transistors", OHSU Digital Commons, Scholar Archive, Ph.D. Thesis, Jul. 1999.

Poate, J M. et al., "Laser Annealing of Semiconductors", Academic Press Inc., New York, NY, p. 533.

* cited by examiner

Primary Examiner — Cheung Lee
(74) Attorney, Agent, or Firm — Murphy, Bilak & Homiller, PLLC

(57) ABSTRACT

A semiconductor body having a first surface is provided. A deep doped region of the semiconductor body is formed using masked ion implantation to implant dopant atoms into a discrete region within the semiconductor body. A structured anti-reflective coating region is formed on a portion of the first surface that is aligned with the deep doped region in a lateral direction of the semiconductor body, the lateral direction being parallel to the first surface. A laser thermal anneal of the deep doped region of the semiconductor body is performed through the anti-reflective coating region thereby activating the implanted dopant atoms in the deep doped region.

20 Claims, 32 Drawing Sheets

LASER THERMAL ANNEALING OF DEEP DOPED REGION USING STRUCTURED ANTIREFLECTIVE COATING

The instant application relates to techniques for forming doped semiconductor regions, and more particularly relates to techniques for activating deeply implanted dopant atoms using laser thermal annealing.

BACKGROUND

Ion implantation is a widely used technique for forming the many doped regions of a semiconductor device, e.g., source regions, drain regions, collector regions, emitter regions, etc. In general, ion implantation refers to a technique whereby ionized dopant atoms are accelerated into a surface of a semiconductor body at high energy, thereby driving the dopant atoms into the semiconductor body. The penetration depth of the dopant atoms depends upon a number of parameters including dopant type, semiconductor material structure and implantation energy. Once the dopant atoms are implanted into the semiconductor substrate, an activation step must be performed to electrically activate the implanted dopant atoms and to repair the crystalline damage in the implanted region. This is done by annealing the substrate (e.g., at temperatures of 700° C. or higher) to cause the implanted dopant atoms to move into substitutional lattice sites within the semiconductor body.

Laser thermal annealing (LTA) has developed as a promising technique for dopant activation. Generally speaking, laser thermal annealing refers to a technique whereby radiation from a beam of a laser source is directed into a selected portion of a semiconductor body. In contrast to a conventional furnace process, laser thermal annealing focuses the energy only on the selected portion. Thus, one particular portion can be annealed while the adjacent regions remain at or close to room temperature. One advantage of laser thermal annealing is a very high ratio of activation of the implanted dopant atoms. In fact, nearly perfect activation of the implanted dopant atoms (e.g., greater than 90%, 95% or even 99% activation) is possible using laser thermal annealing. Moreover, laser thermal annealing is very fast and requires a low thermal budget, as the laser quickly energizes precisely targeted regions while other regions of the semiconductor body are not energized.

One example of laser thermal annealing is described in U.S. Pat. No. 7,842,590 to Gutt et al., the content of which is incorporated by reference by its entirety. The Gutt document discloses a high-voltage diode with a structured p-doped region 5 disposed adjacent to an n-type field stop region 4. The structured p-doped region 5, among other things, improves the electrical performance of the device by providing compensating carriers during device commutation. Similar advantages are realized in an IGBT version of the device. The structured p-doped regions 5 are formed by implanting dopant atoms into the second surface 12 of the substrate. A laser thermal anneal is performed to activate the dopant atoms for the structured p-doped regions 5.

One drawback of the laser thermal annealing process described in Gutt is that perfect or near perfect activation of the implanted dopant atoms is only possible if the structured p-doped regions 5 are implanted relatively close to the second surface 12 of the substrate. That is, the laser thermal annealing process limits the implantation depth of the dopant atoms. For example, conventional laser thermal annealing techniques are only able to achieve perfect or near perfect activation of the implanted dopant atoms up to a depth of 400 nm (nanometers). In many cases, it is desirable to form doped regions beyond this depth of 400 nm. For example, in the case of the Gutt patent described above, it would be beneficial to form the at least a part of the structured p-doped regions 5 further than 400 nm second surface 12 so that a more robust emitter layer can be fabricated. Conventionally, this can only be done by some combination of processes that are costly and/or do not fully activate the implanted dopant atoms.

SUMMARY

A method for forming a semiconductor device is disclosed. According to an embodiment, a semiconductor body having a first surface is provided. A deep doped region of the semiconductor body is formed using masked ion implantation to implant dopant atoms into a discrete region within the semiconductor body. A structured anti-reflective coating region is formed on a portion of the first surface that is aligned with the deep doped region in a lateral direction of the semiconductor body, the lateral direction being parallel to the first surface. A laser thermal anneal of the deep doped region of the semiconductor body is performed through the anti-reflective coating region thereby activating the implanted dopant atoms in the deep doped region.

According to another embodiment, a semiconductor body having a first surface is provided. A laser thermal annealing tool that is configured to locally anneal a portion of the semiconductor body beneath the first surface is provided. A deep doped region is formed in a portion of the semiconductor body that is beyond a dopant activation range of the laser thermal annealing tool. A structured anti-reflective coating region is formed on a portion of the first surface. A laser thermal anneal of the deep doped region of the semiconductor body is performed through the anti-reflective coating region using the laser thermal annealing tool thereby activating the dopant atoms in the deep doped region.

According to another embodiment, a semiconductor body having a first surface is provided. A doped layer that extends from the first surface into the semiconductor body is formed. A structured anti-reflective coating region is formed on the first surface over a portion of the doped layer. A laser thermal anneal is performed through the structured anti-reflective coating and outside of the structured anti-reflective coating thereby activating the implanted dopant atoms directly below the structured anti-reflective coating as well as the implanted dopant atoms that are laterally adjacent to the structured anti-reflective coating. The laser thermal anneal activates the implanted dopant atoms directly below the structured anti-reflective coating at a greater depth from the first surface than the implanted dopant atoms that are laterally adjacent to the structured anti-reflective coating.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
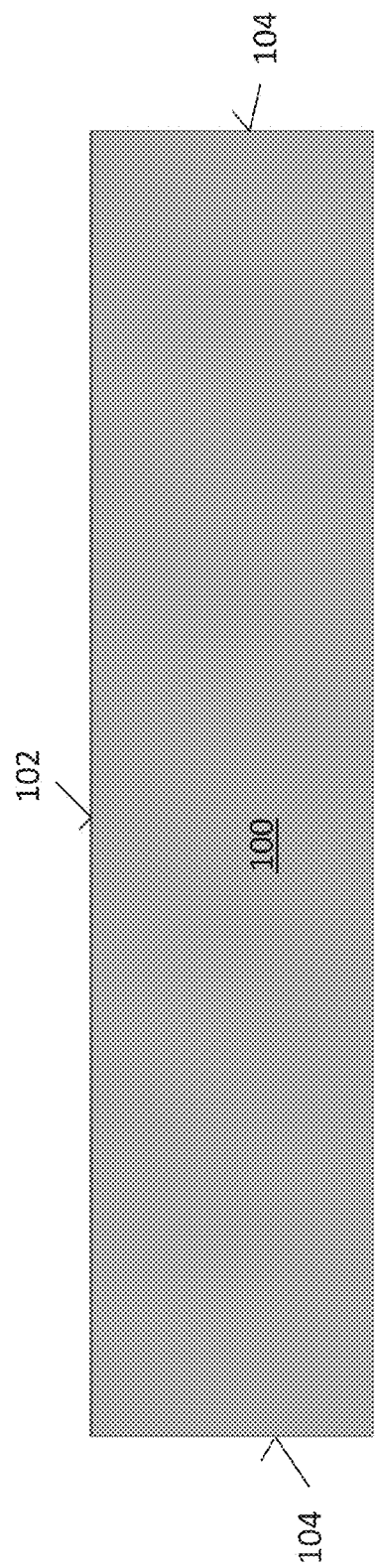
FIG. 1 illustrates providing a semiconductor body, according to an embodiment.

According to embodiments described herein, a structured anti-reflective coating region is used in conjunction with a laser thermal anneal to enhance activation depth of dopant atoms in a deep doped region. According to one embodiment, dopant atoms are implanted into a semiconductor body using masked ion implantation to form a structured deep doped region that is beyond the range for complete or nearly complete activation of the dopant atoms using a conventional laser thermal anneal technique. For example, at least a portion of the deep doped region may be disposed further than 400 nm beneath the surface of the semiconductor body. A structured anti-reflective coating region is formed on the surface of the semiconductor body. The structured anti-reflective coating region aligns with the deep doped region. A laser thermal anneal is performed through the structured anti-reflective coating region thereby activating the dopant atoms in the deep doped region. The anti-reflective coating reflects less radiation than the surface of the semiconductor body, and consequently directs more energy into the semiconductor body. As a result, perfect or near perfect activation of the dopant atoms (e.g., 90%, 95% or even 99% activation) in the deep doped region is possible. Moreover, this activation rate can be achieved without increasing the laser energy or damaging the crystalline lattice of the semiconductor body.

The structuring techniques described herein advantageously mitigate problems associated with anti-reflective coating materials. In general, anti-reflective coating materials (e.g., silicon dioxide ($SiO_2$) or silicon nitride (SiN)) can be delicate and difficult to work with, as there is a high likelihood of cracking or buckling (i.e., wrinkles). This is attributable to, among other things, the thickness of anti-reflective coating and the mismatch in coefficients of thermal expansion between the anti-reflective coating and the semiconductor. In addition, anti-reflective coating materials can inherently exert compressive or tensile stress on the semiconductor body due to thermal oxidation of silicon, for example. Various techniques for structuring the anti-reflective coating are described. One technique includes two photolithography processes in which a patterned first photoresist is used to form the the deep doped region and a patterned second photoresist is used to form the structured anti-reflective coating region. Another technique includes only one photolithography process in which a patterned first photoresist is used to form both the deep doped region and the structured anti-reflective coating region. In any of these techniques, the area occupied by the anti-reflective coating region is closely correlated (and in fact may be identical) to the area of the implanted dopant atoms. In this way, the issues related to cracking or buckling of the anti-reflective coating are mitigated, as the lateral area of the anti-reflective coating is formed in the minimum amount necessary to activate the dopant atoms in the buried doped region using a laser thermal anneal.

Referring to FIG. 1, a semiconductor body 100 is provided. The semiconductor body 100 includes a first surface 102 extending between two edge sides 104. A lateral direction of the semiconductor body 100 refers to a direction that is parallel to the first surface 102. A vertical direction of the semiconductor body 100 refers to a direction that is perpendicular to the first surface 102. According to an embodiment, the semiconductor body 100 is a monocrystalline silicon substrate. Generally speaking, the semiconductor body 100 can include any semiconductor material that is used to form integrated circuit devices, including silicon (Si), silicon-on-insulator (SOI), silicon-on sapphire (SOS), doped and undoped semiconductors, epitaxial layers of silicon supported by a base semiconductor foundation, and other semiconductor structures. The semiconductor material of the semiconductor body 100 need not be silicon-based. The semiconductor body 100 could as well include silicon germanium (SiGe), germanium (Ge) or gallium arsenide (GaAs), to name a few examples. According to other embodiments, the semiconductor body 100 could include silicon carbide (SiC) or gallium nitride (GaN).

Figure 2:
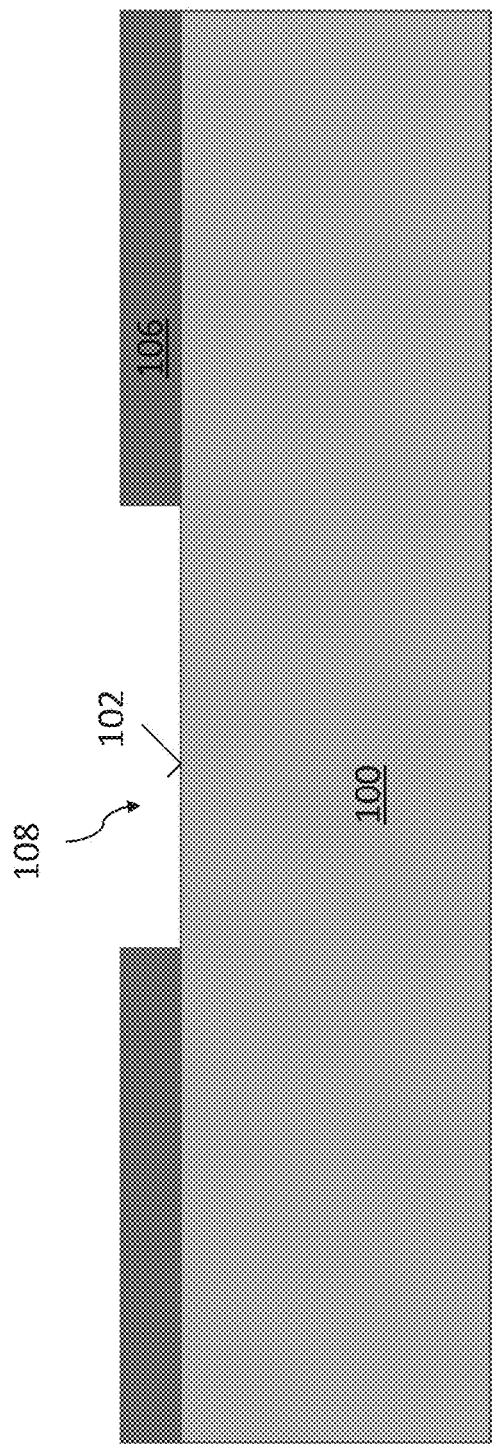
FIG. 2 illustrates forming a patterned first photoresistive layer on the semiconductor body, according to an embodiment.

Referring to FIG. 2, a patterned first photoresistive layer 106 has been formed on the first surface 102. The patterned first photoresistive layer 106 is configured as an implant mask so as to prevent energized dopant atoms from reaching and penetrating the semiconductor body 100. The patterned first photoresistive layer 106 includes a first opening 108 that exposes a selected portion of the first surface 102, while remaining portions of the first surface 102 are covered by the first photoresistive layer 106. The patterned first photoresistive layer 106 can be made from any of a variety of conventionally known photoresist material, and can be formed according to any of a variety of conventionally known photolithography techniques.

Figure 3:
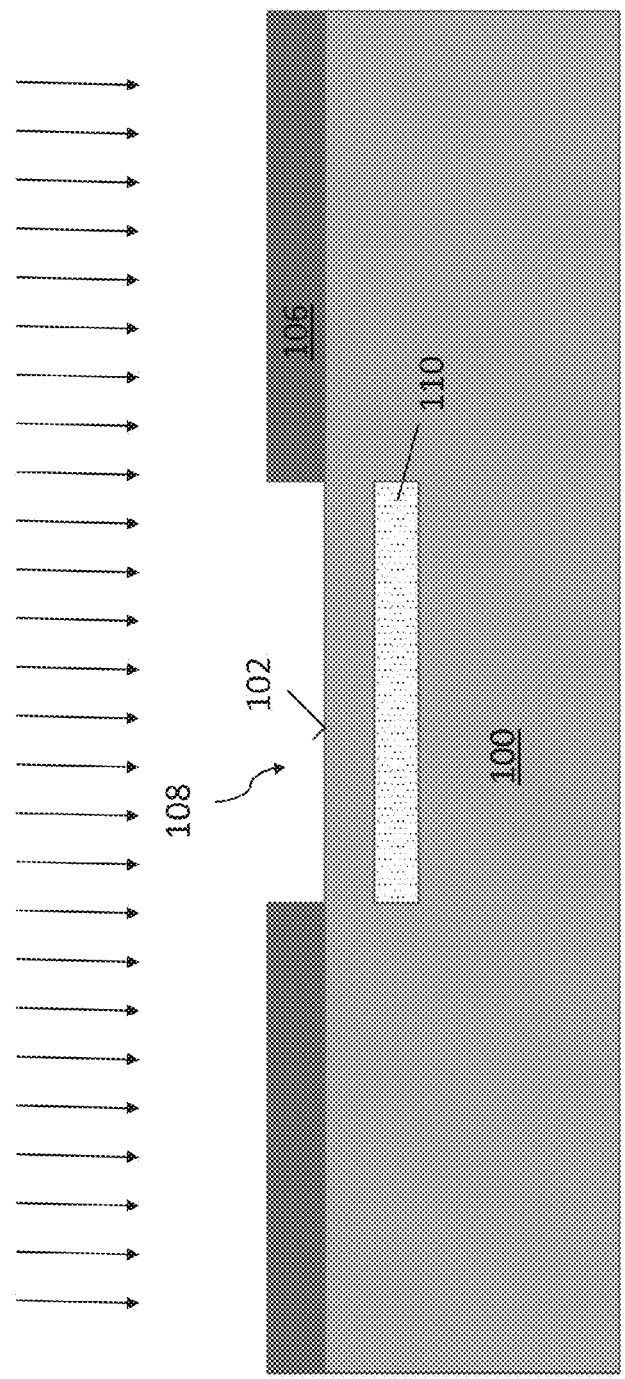
FIG. 3 illustrates masked implantation of dopant atoms into a deep region of the semiconductor body, according to an embodiment.

Referring to FIG. 3, dopant atoms are implanted into the semiconductor body 100. The dopant atoms are energized and driven into the semiconductor body 100 through the first opening 108 in the patterned first photoresistive layer 106, while patterned first photoresistive layer 106 acts as a mask that layer prevents the dopant atoms from penetrating the semiconductor body 100 outside of the first opening 108. The dopant atoms can be any impurity element that modifies the intrinsic conductivity of the semiconductor body 100. Examples include boron, arsenic, phosphorous, gallium, indium, arsenic, silicon and germanium, to name a few.

The implantation energy of the implantation process is sufficient to implant the dopant atoms into a discrete, structured region that is spaced apart from the first surface 102 and surrounded by portions of the semiconductor body 100 that are devoid of the implanted dopant atoms. This discrete, structured region may be considered a deep doped region 110 in that it is formed beyond the range for complete or near complete (e.g., at least 90%) activation of the dopant by operating a laser at 4 J/cm$^2$. For example, the deep doped region 110 may be formed between 400 nm and 1000 nm beneath the surface. As is well known within the art, the penetration depth of dopant atoms in ion implantation process follows a gaussian distribution. The dopant depths described herein refer to a target for the average penetration depth of the dopant atoms.

Figure 4:
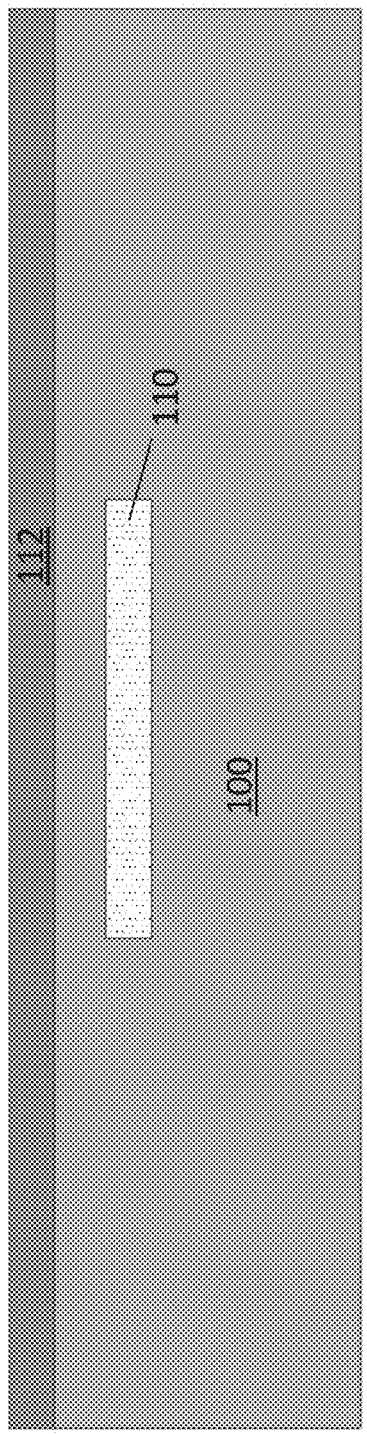
FIG. 4 illustrates forming an anti-reflective coating layer on the semiconductor body, according to an embodiment.

Referring to FIG. 4, the patterned first photoresistive layer 106 has been removed from the semiconductor body 100. This can be done using a wet chemical etch which may require ultrasonic excitation, for example. Once the patterned first photoresistive layer 106 has been removed, a layer of anti-reflective coating 112 is formed directly on the first surface 102. In general, the layer of anti-reflective coating 112 may be any transparent material with a refractive index between the semiconductor body 100 and air. That is, the layer of anti-reflective coating 112 reflects less light than the first surface 102 of the semiconductor body 100. Exemplary materials for the layer of anti-reflective coating 112 include semiconductor oxides (e.g., $SiO_2$) and semiconductor nitrides (e.g., SiN). Other examples include diamond and sapphire. The layer of anti-reflective coating 112 can be formed in a high temperature front-end-of-the-line (FEOL) process or alternatively can be formed in a low-temperature back-end-of-the-line (BEOL) process.

Figure 5:
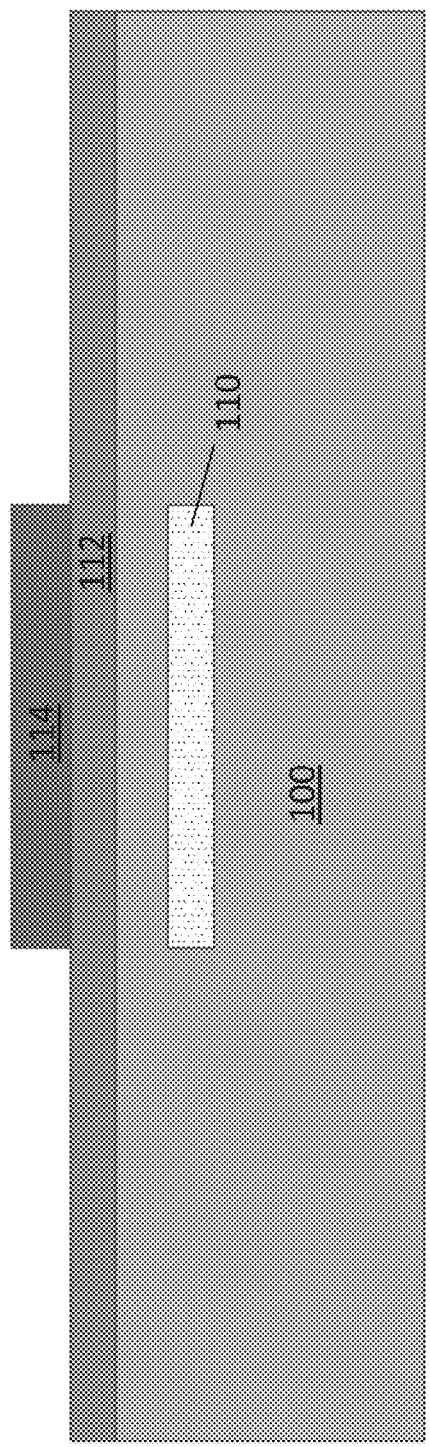
FIG. 5 illustrates forming a patterned second photoresistive layer on the anti-reflective coating layer, according to an embodiment.

Referring to FIG. 5, a patterned second photoresistive layer 114 has been formed on the layer of anti-reflective coating 112. The patterned second photoresistive layer 114 can be formed from the same material and/or according to similar techniques as the patterned first photoresistive layer 106. The patterned second photoresistive layer 114 has an inverse geometry as the patterned first photoresistive layer 106. That is, the photoresistive material of the patterned second photoresistive layer 114 is formed where the patterned first photoresistive layer 106 is absent (i.e., the first opening 108) and is absent where the patterned first photoresistive layer 106 is present. According to an embodiment, this inverse geometry can be achieved by forming the patterned first photoresistive layer 106 from a photoresist material with an opposite polarity as the material used to form the patterned second photoresistive layer 114. In this case, the same photomask produces the inverse geometry with the different polarity photoresist. Alternatively, two photomasks with inverse geometry can be used.

Figure 6:
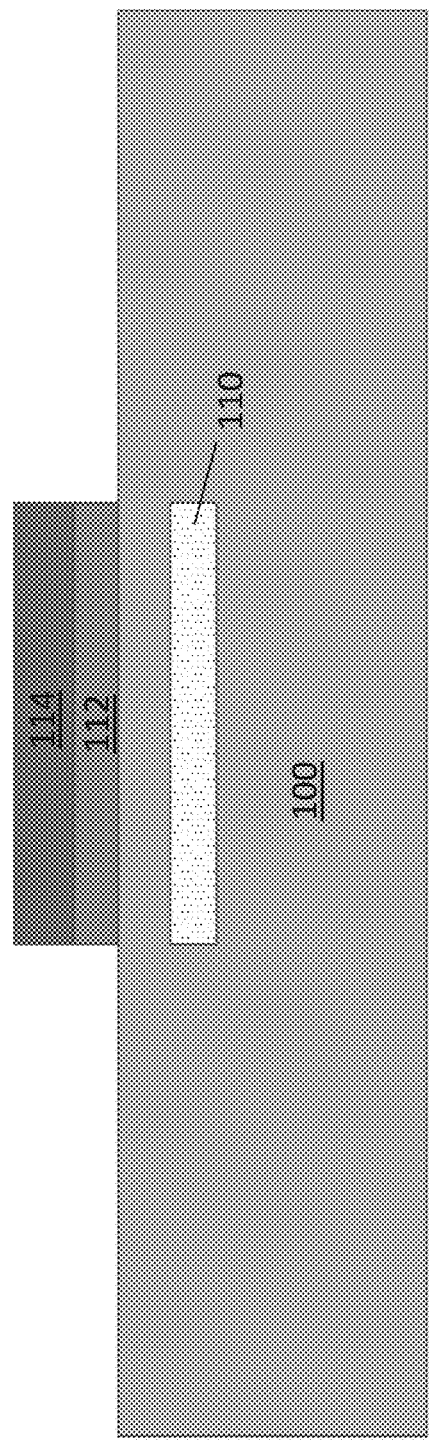
FIG. 6 illustrates masked etching of the anti-reflective coating layer, according to an embodiment.

Referring to FIG. 6, portions of the layer of anti-reflective coating 112 that are exposed from the patterned second photoresistive layer 114 are removed. That is, the anti-reflective coating that is laterally outside of the coverage area of the patterned second photoresistive layer 114 is removed. The anti-reflective coating that is directly beneath the patterned second photoresistive layer 114 remains intact. Removing the portions of the layer of anti-reflective coating 112 may be done using a wet chemical etch, wherein the patterned second photoresistive layer 114 acts as an etch mask, for example.

Figure 7:
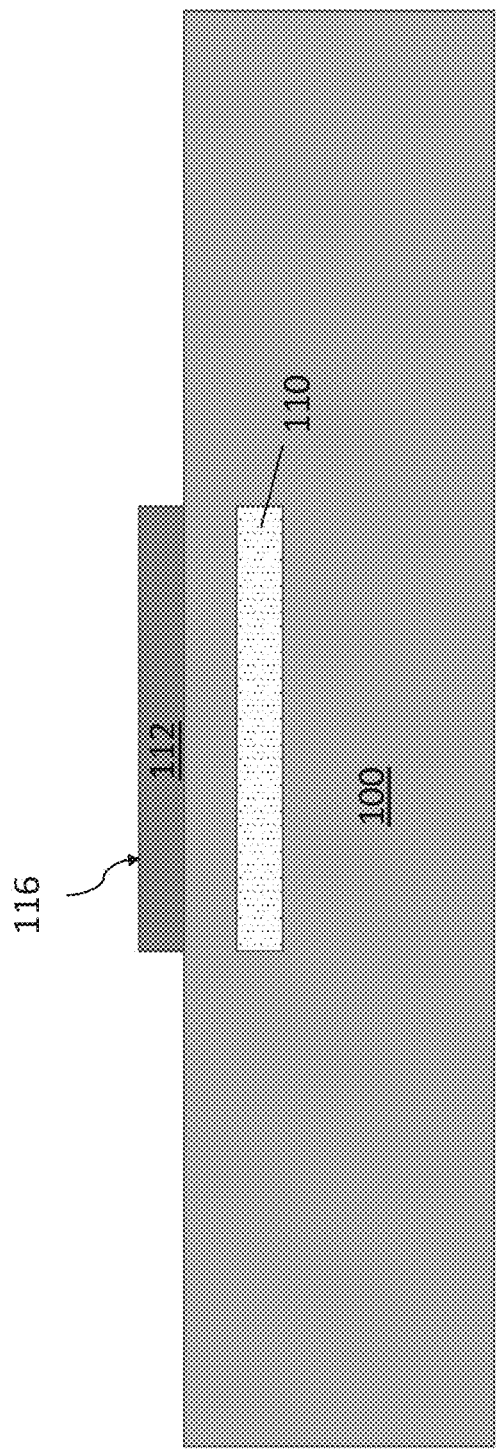
FIG. 7 illustrates removing the patterned second photoresistive layer from the anti-reflective coating, according to an embodiment.

Referring to FIG. 7, the patterned second photoresistive layer 114 is removed while the anti-reflective coating remains intact. This can be done using a wet chemical etch which may be done using ultrasonic excitation, for example. As a result, the semiconductor body 100 includes a deep doped region 110 and a structured anti-reflective coating region 116 directly above the deep doped region 110. The photolithography steps described herein allow for the structured anti-reflective coating region 116 to be laterally aligned with the deep doped region 110. That is, a lateral center of the structured anti-reflective coating region 116 is aligned with a lateral center of the deep doped region 110. According to an embodiment, the structured anti-reflective coating region 116 completely overlaps with the deep doped region 110 in the lateral direction of the semiconductor body 100. That is, the lateral coverage area of the structured anti-reflective coating region 116 is as large or larger than the lateral area of the deep doped region 110, i.e., the perimeter of the deep doped region 110 as defined in the lateral direction of the semiconductor body 100. According to a more particular embodiment, a lateral area of the structured anti-reflective coating region 116 substantially corresponds to a lateral area of the deep doped region 110. The term "substantially corresponds" refers to the fact that the lateral area of the structured anti-reflective coating region 116 is as close as possible to the lateral area of the deep doped region 110 as the processing techniques used to form these regions will permit. Alternatively, the lateral area of the structured anti-reflective coating region 116 may be slightly larger (e.g., 101% or 105% larger than) than the lateral area of the deep doped region 110. This can be achieved by tailoring the geometry of the patterned first and second photoresistive layers 106, 114. Such a configuration may be preferable to account for process variation (e.g., dislocation or misalignment) so as to ensure that the deep doped region 110 is completely covered by the structured anti-reflective coating region 116.

Figure 8:
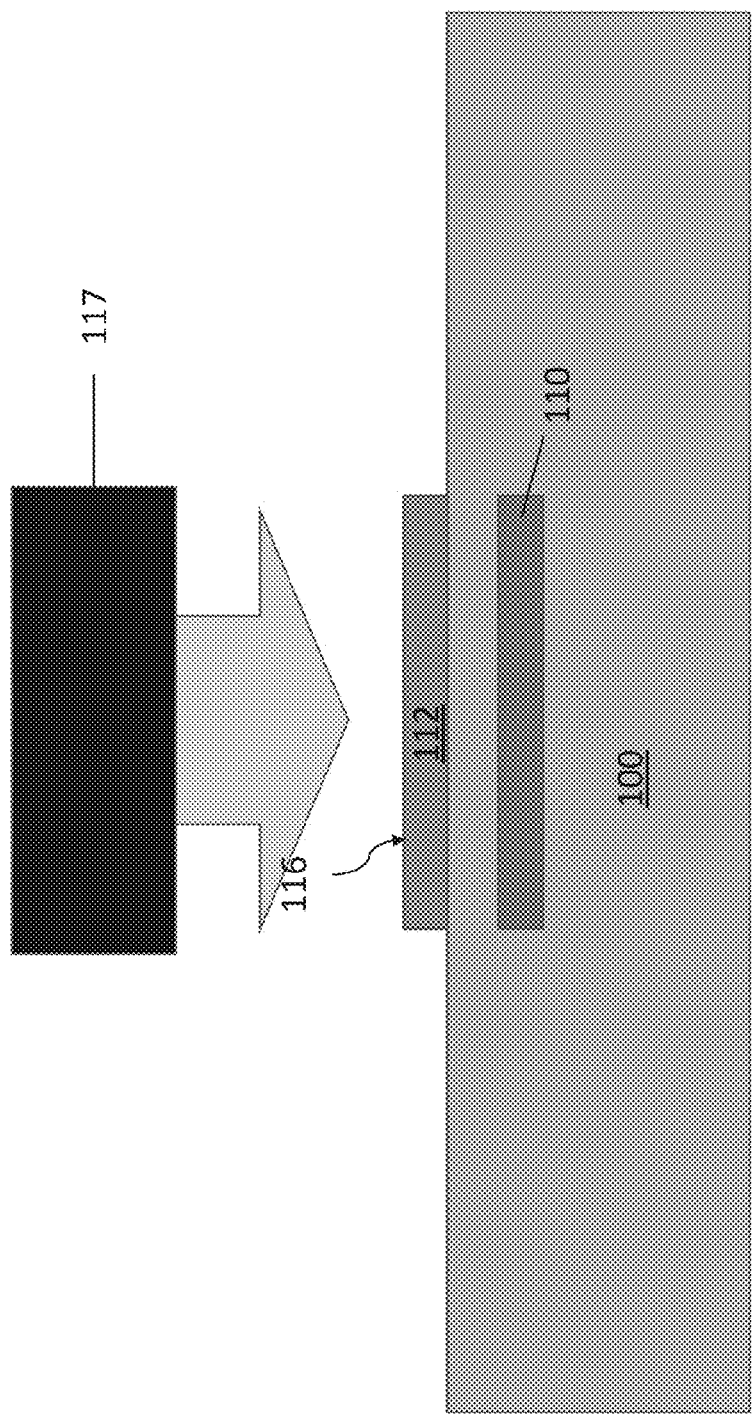
FIG. 8 illustrates applying a laser thermal anneal through the structured anti-reflective coating region thereby activating dopant atoms in the deep doped region, according to an embodiment.

Referring to FIG. 8, a laser thermal annealing process is applied to the semiconductor body 100 to activate the dopant atoms in the deep doped region 110. According to this technique, a laser thermal annealing tool 117 is positioned over the structured anti-reflective coating region 116. The laser thermal annealing tool 117 generates a radiation or beam of a laser that is directed through the structured anti-reflective coating region 116. The radiation or beam may include a sequence of multiple pulses. The radiation or beam delivers enough energy into the semiconductor body 100 to at least partially melt the semiconductor body 100. According to an embodiment, the radiation or beam energy apple n energy of approximately, 4 J/cm$^2$.

Advantageously, the anti-reflective properties of the structured anti-reflective coating region 116 enable complete or near complete (e.g., greater than 90%, 95% or 99%) activation of the dopant atoms within the deep doped region 110. Moreover, this activation ratio is achieved without increasing the radiation or beam energy and without increasing the melt depth of the laser by damaging the crystalline lattice. In other words, the structured anti-reflective coating region 116 enables the activation of the dopant atoms in a location that is beyond the dopant activation range of the laser thermal annealing tool 117. The dopant activation range as used herein refers to a depth from the surface of a semiconductor substrate that does not include antireflective coating for which a laser thermal annealing tool that is operated at an energy that does not damage the crystalline structure of the substrate can activate dopant atoms. For example, without the structured anti-reflective coating region 116, the laser thermal annealing tool 117 may not be able to activate dopant atoms that are implanted beyond 400 nm using a nominal laser beam energy of 4 J/cm$^2$ that that does not damage the crystalline structure of the substrate. Due to the structured anti-reflective coating region 116, activation at greater depths, (e.g., 400 nm to 1000 nm) is possible for the same laser thermal annealing tool 117 and the same laser beam energy. These values are provided as an example, and it should be understood that the dopant activation range may vary depending on a variety of factors, including the laser thermal annealing tool and the material of the substrate for example.

The process steps described with reference to FIG. 1-8 can be combined with any other conventionally known semiconductor processing steps, e.g., masking, doping, etching, deposition, etc. to form a completely functional semiconductor device. The deep doped region 110 can be used to form any of a variety of discrete doped regions in a semiconductor device, including active device regions (e.g., source regions, body regions, collector regions, emitter regions, anode regions, cathode regions) and additional structures that modify the electrical properties of the device in some way (e.g., structured collector or emitter regions). Although FIGS. 1-8 illustrate the formation of one deep doped region 110, those having ordinary skill will appreciate that the mask patterns can be configured to create any number of the deep doped regions 110, with any desired geometry and location within a single semiconductor body 100.

FIGS. 9-14 refer to an alternate embodiment in which the order of forming the patterned first and second photoresistive layers 106, 114 is reversed. In the embodiment of FIGS. 1-8, the patterned first photoresistive layer 106 is formed before the patterned second photoresistive layer 114 is formed, the patterned first photoresistive layer 106 is removed from the first surface 102 after implanting the dopant atoms, and the layer of the anti-reflective coating and the patterned second photoresistive layer 114 are formed after removing the patterned first photoresistive layer 106. By contrast, according to the technique of FIGS. 9-14, the layer of the anti-reflective coating is formed and the patterned second photoresistive layer 114 is formed before the patterned first photoresistive layer 106 is formed, and the patterned first photoresistive layer 106 is formed around the structured anti-reflective coating region 116 after removing the layer of anti-reflective coating 112 that are exposed from the patterned second photoresistive layer 114.

Figure 9:
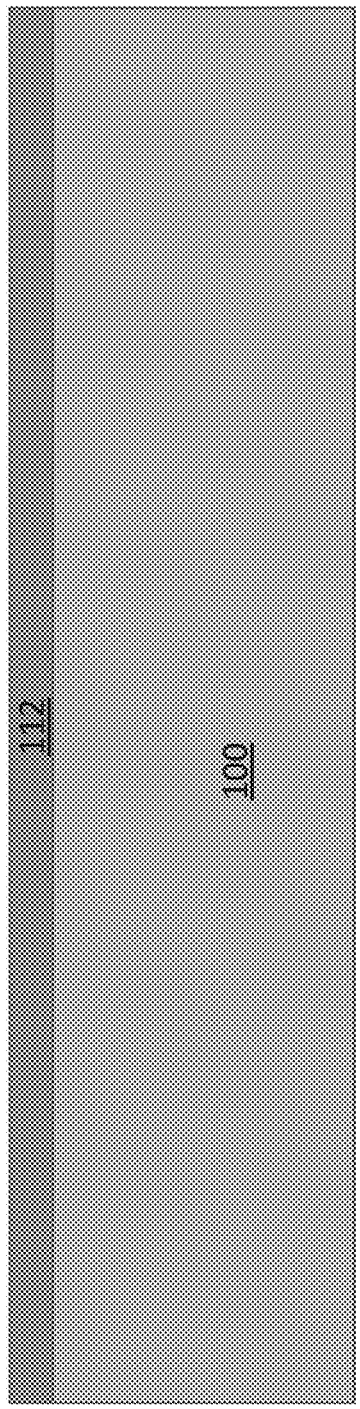
FIG. 9 illustrates providing a semiconductor body and forming an anti-reflective coating layer on the semiconductor body, according to an embodiment.

Referring to FIG. 9, a semiconductor body 100 as described with reference to FIG. 1 has been provided. After providing the semiconductor body 100, the layer of anti-reflective coating 112 is formed directly on the first surface 102 of the semiconductor body 100.

Figure 10:
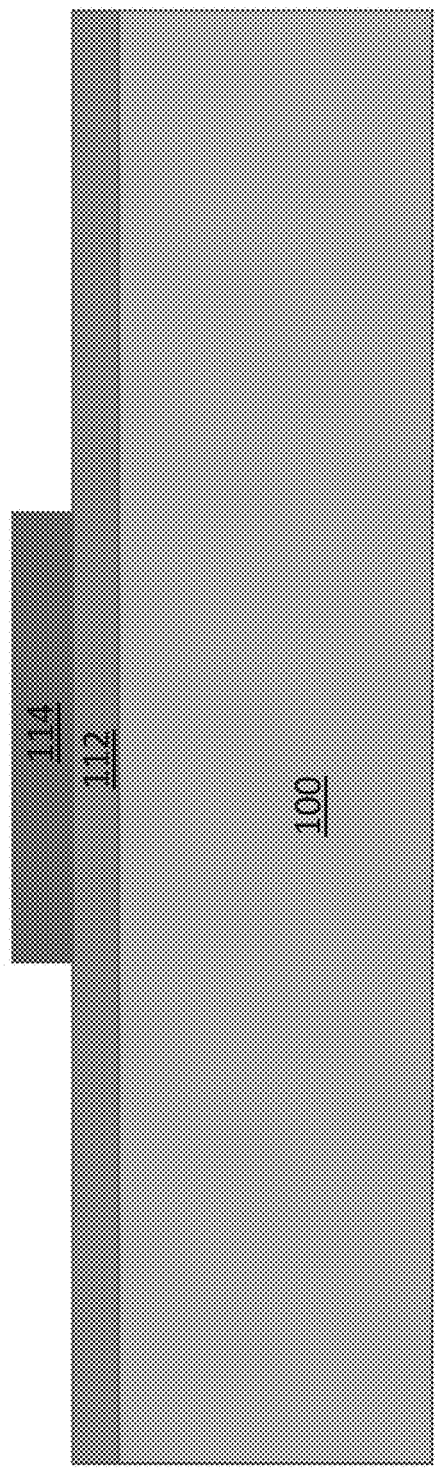
FIG. 10 illustrates forming a patterned second photoresistive layer on the anti-reflective coating layer, according to an embodiment.

Referring to FIG. 10, the patterned second photoresistive layer 114 is formed directly on the layer of anti-reflective coating 112. The patterned second photoresistive layer 114 can be formed in the manner described with reference to FIG. 5, for example.

Figure 11:
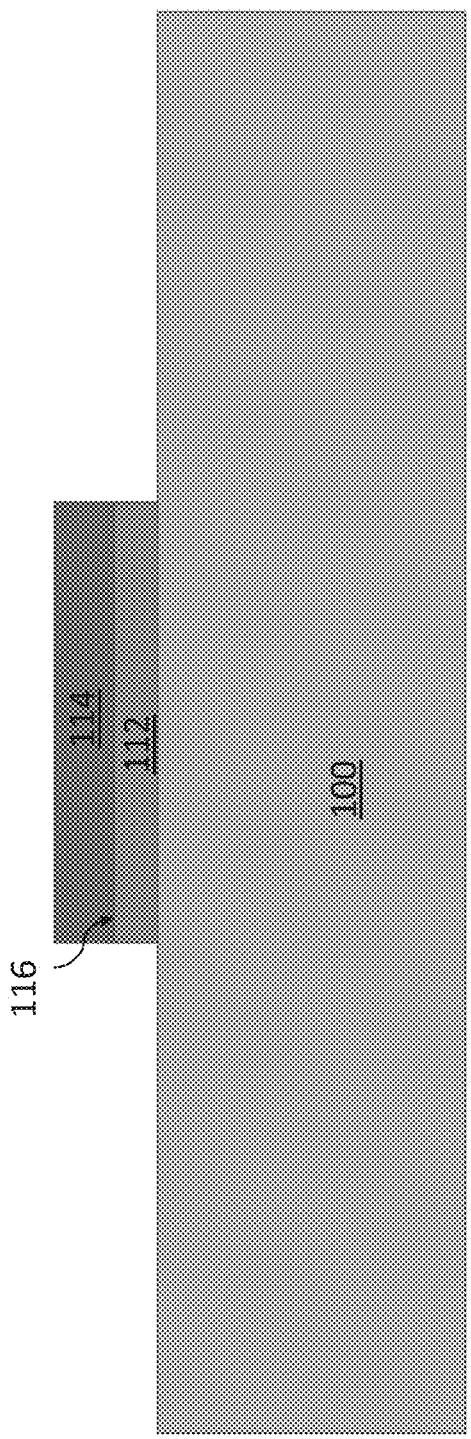
FIG. 11 illustrates masked etching of the anti-reflective coating layer, according to an embodiment.

Referring to FIG. 11, portions of the layer of anti-reflective coating 112 that are exposed from the patterned second photoresistive layer 114 are removed. The layer of anti-reflective coating 112 can be removed in the manner described with reference to FIG. 6, for example.

Figure 12:
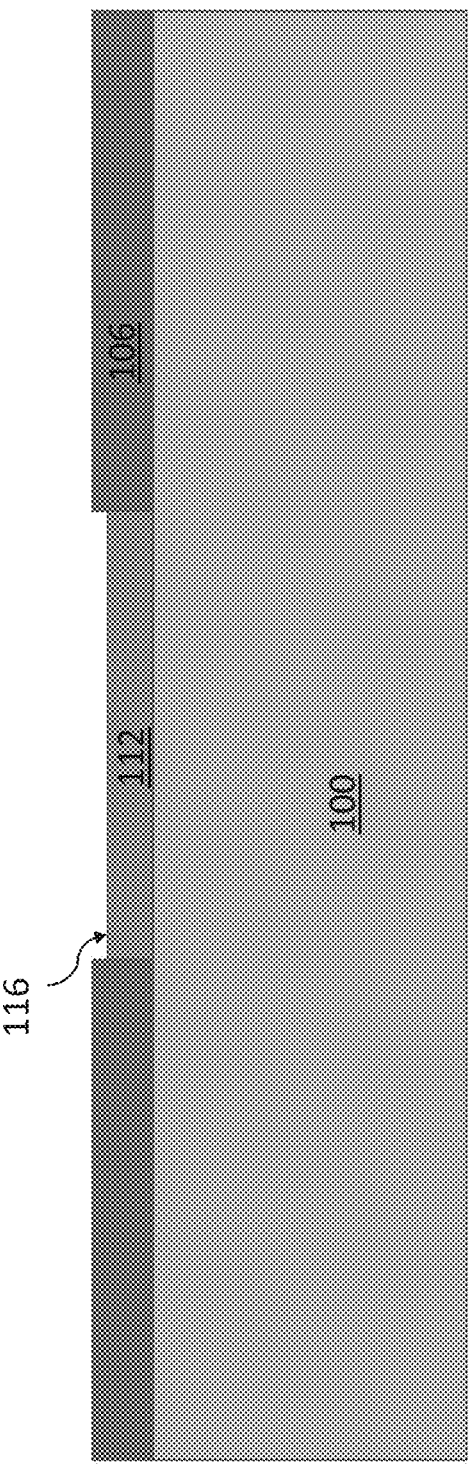
FIG. 12 illustrates forming a patterned first photoresistive layer around the structured anti-reflective coating region, according to an embodiment.

Referring to FIG. 12, the patterned first photoresistive layer 106 has been formed around the structured anti-reflective coating region 116. The patterned first photoresistive layer 106 can be formed in the manner described with reference to FIG. 2, for example.

Figure 13:
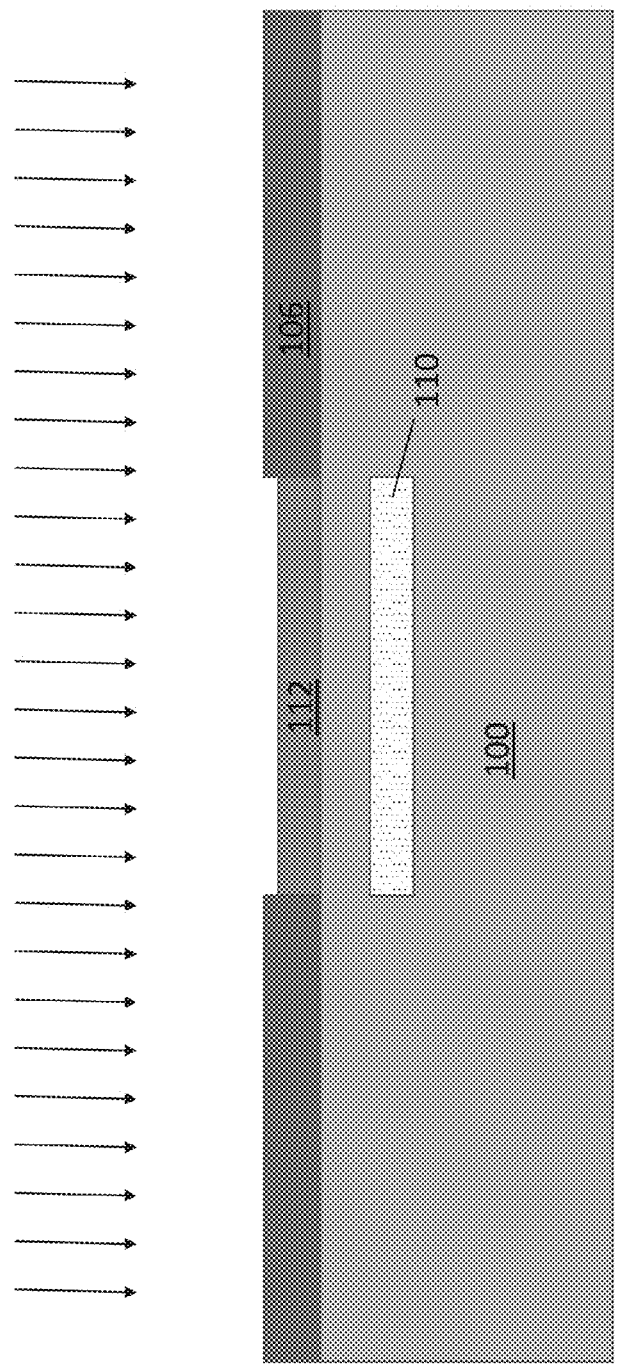
FIG. 13 illustrates masked implantation of dopant atoms through the structured anti-reflective coating region into a deep region of the semiconductor body, according to an embodiment.

Referring to FIG. 13, dopant atoms are implanted into the semiconductor body 100. In this case, the dopant atoms first penetrate through the structured anti-reflective coating region 116 and then into the semiconductor body 100. The patterned first photoresistive layer 106 acts as an implantation mask and thus enables the formation of a deep doped region 110 that is structured in the manner previously described. The dopant implantation technique may be similar or identical to the technique described with reference to FIG. 3. The implantation energy may be adjusted to account for the structured anti-reflective coating region 116 to ensure that the dopant atoms reach a desired depth within the semiconductor body 100.

Figure 14:
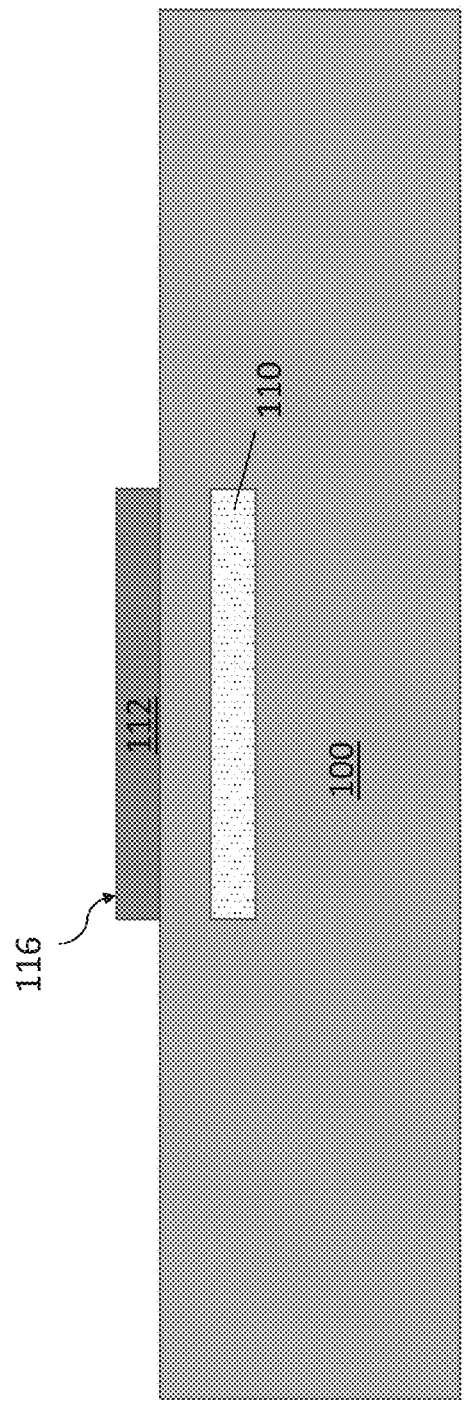
FIG. 14 illustrates removing the patterned first photoresistive layer, according to an embodiment.

Referring to FIG. 14, the patterned first photoresistive layer 106 has been removed. This may be done in the manner described with reference to FIG. 7, for example. Once the patterned first photoresistive layer 106 has been removed, the device corresponds to the device depicted in FIG. 7. That is, the device includes a semiconductor body 100 with an identically configured structured anti-reflective coating region 116 and deep doped region 110 as shown in FIG. 7. Thus, the laser thermal annealing process described with reference to FIG. 8 may be applied to the device of FIG. 7 in a similar or identical manner as previously described to activate the dopant atoms in the deep doped region 110.

Figure 15:
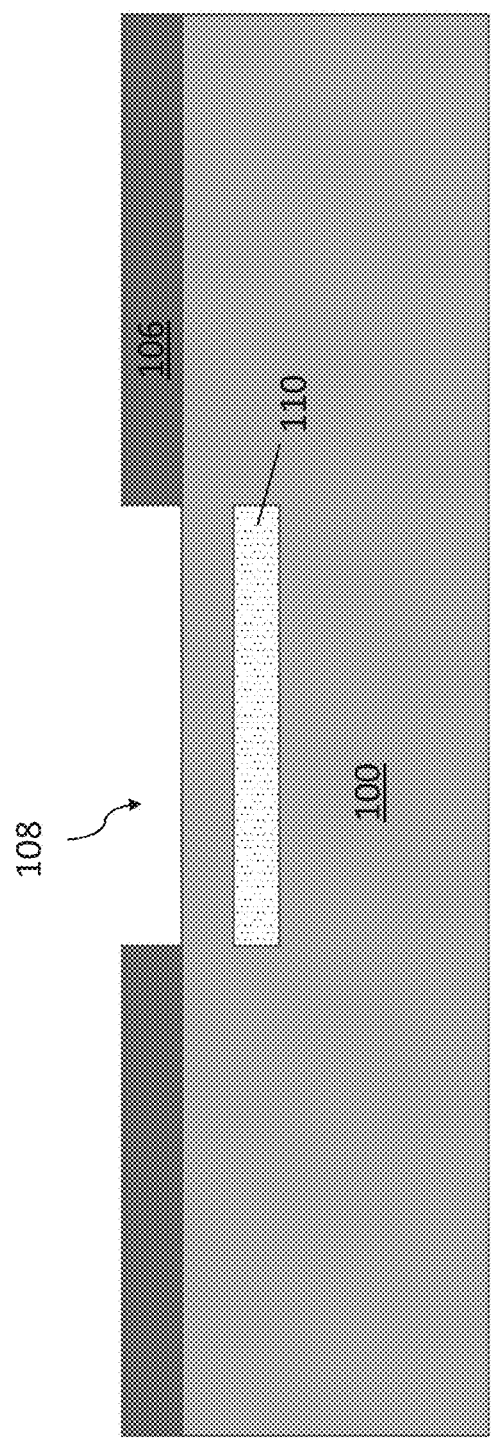
FIG. 15 illustrates providing a semiconductor body with a patterned first photoresistive layer and a deep doped region with non-active dopant atoms, according to an embodiment.
Figure 16:
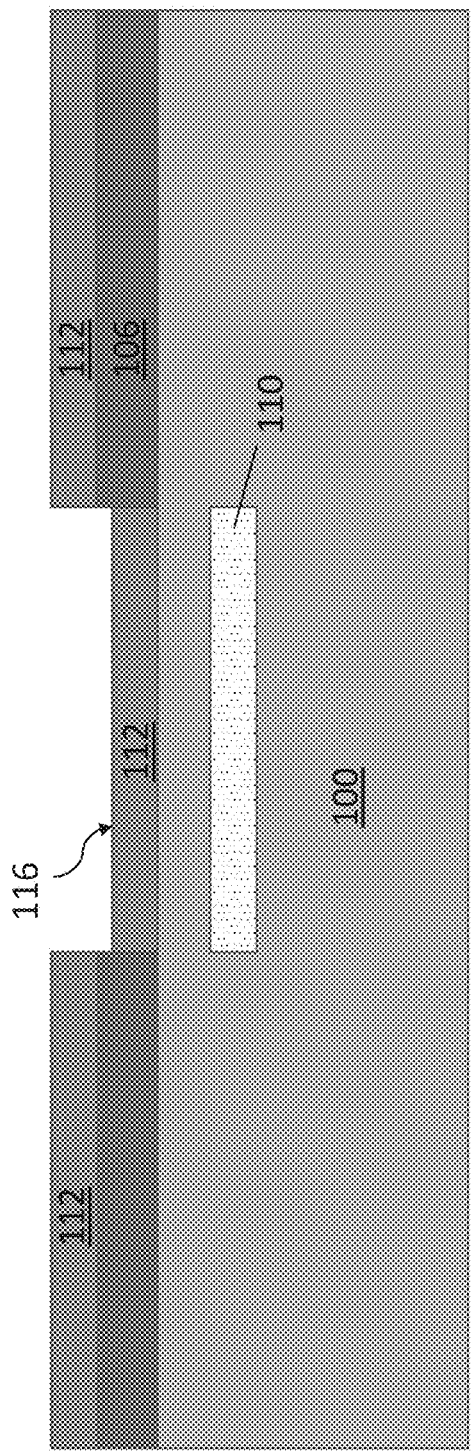
FIG. 16 illustrates forming an anti-reflective coating layer that covers the patterned first photoresistive layer and fills an opening of the first photoresistive layer, according to an embodiment.
Figure 17:
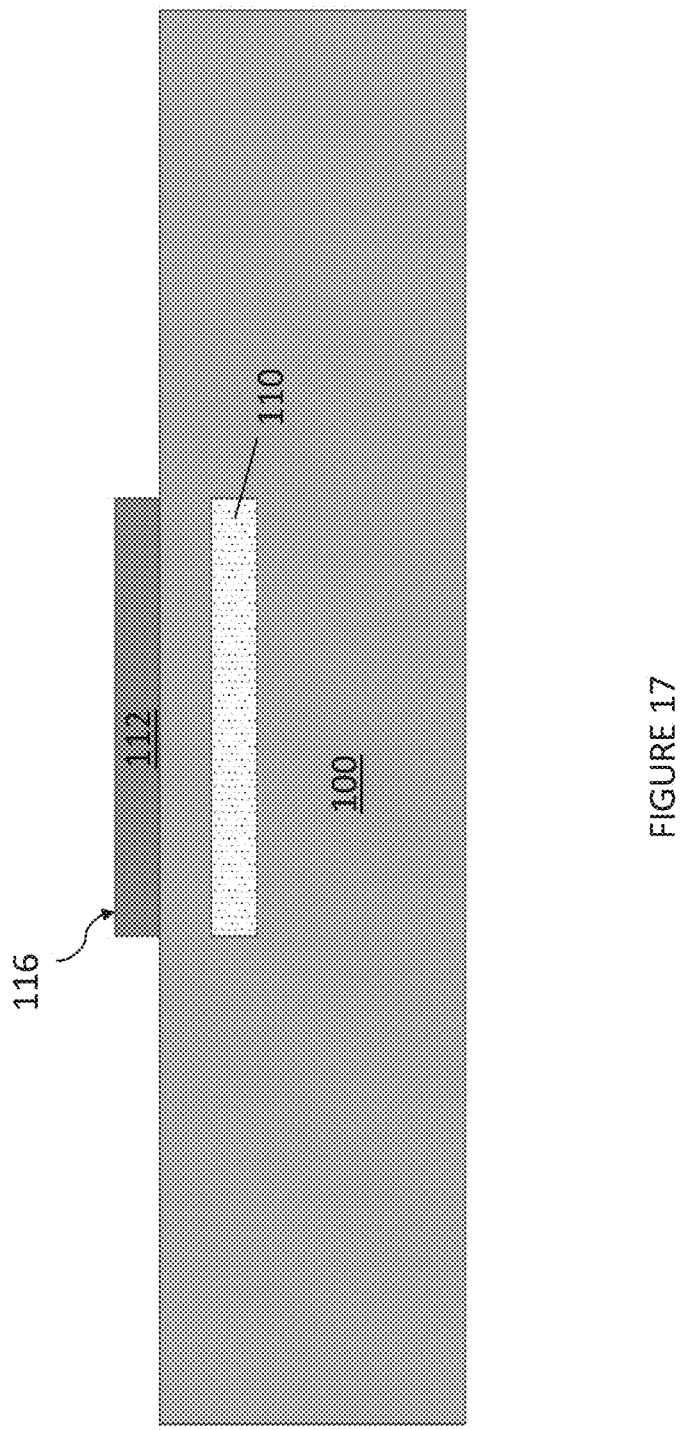
FIG. 17 illustrates removing the anti-reflective coating layer that covers the patterned first photoresistive layer and the patterned first photoresistive layer, according to an embodiment.

FIGS. 15-17 refer to an alternate embodiment for forming and activating the deep doped region 110 in which only one photolithography step is used. The previously described techniques require the formation of first and second patterned photoresistive layers 106, 114. By contrast, in the embodiments of FIG. 15, only a patterned first photoresistive layer 106 is formed. As will be demonstrated in further detail, the geometry of the patterned first photoresistive layer 106 is used to define the lateral boundaries of both the deep doped region 110 and the structured anti-reflective coating region 116.

Referring to FIG. 15, a semiconductor body 100 having the patterned first photoresistive layer 106 and the deep doped region 110 (before dopant activation) is provided. This device can be produced using the techniques described with reference to FIGS. 1-3, for example.

Referring to FIG. 16, a layer of anti-reflective coating 112 is deposited on the semiconductor body 100 and patterned first photoresistive layer 106 of FIG. 15. The layer of anti-reflective coating 112 can have the same material composition and can be formed according to a low temperature deposition method. Due to the presence of the patterned first photoresistive layer 106, the layer of anti-reflective coating 112 partially forms on the patterned first photoresistive layer 106 and partially forms on the first surface 102 of the semiconductor body 100. That is, the layer of anti-reflective coating 112 covers the patterned first photoresistive layer 106 and fills the first opening 108 of the patterned first photoresistive layer 106. In this way, one mask pattern defines the lateral area of both the deep doped region 110 and the structured anti-reflective coating region 116.

Referring to FIG. 17, the patterned first photoresistive layer 106 and the portions of the layer of anti-reflective coating 112 that cover the patterned first photoresistive layer 106 have been removed. According to an embodiment, this is done by a so-called lift off technique. In general, a lift off technique refers to a process of selectively removing layers from a semiconductor body by removing the subjacent material that physically supports the selected regions. In the example of FIG. 17, the patterned first photoresistive layer 106 is used as a lift off layer. The device is exposed to a chemical etchant that is highly selective to the material of the patterned first photoresistive layer 106 but not the semiconductor body 100 and the anti-reflective coating. That is, the etchant nominally removes only the patterned first photoresistive layer 106 without removing the other materials. As a result, the patterned first photoresistive layer 106 and the material supported by the patterned first photoresistive layer 106, i.e., portions of the layer of anti-reflective coating 112 that are disposed on the patterned first photoresistive layer 106, are removed. The anti-reflective coating that remains on the substrate is structured in a similar manner described with reference to FIG. 7. Thus, a device that corresponds to the device depicted in FIG. 7 is produced. Subsequently, the laser thermal annealing described with reference to FIG. 8 may be performed in a similar or identical manner to activate the dopant atoms in the deep doped region 110.

FIGS. 18-24 refer to another embodiment for forming and activating the deep doped region 110 using a laser thermal anneal in which only one photolithography step is used. This technique again requires only one patterned first photoresistive layer 106 to define the lateral boundaries of both the deep doped region 110 and the structured anti-reflective coating region 116.

Figure 18:
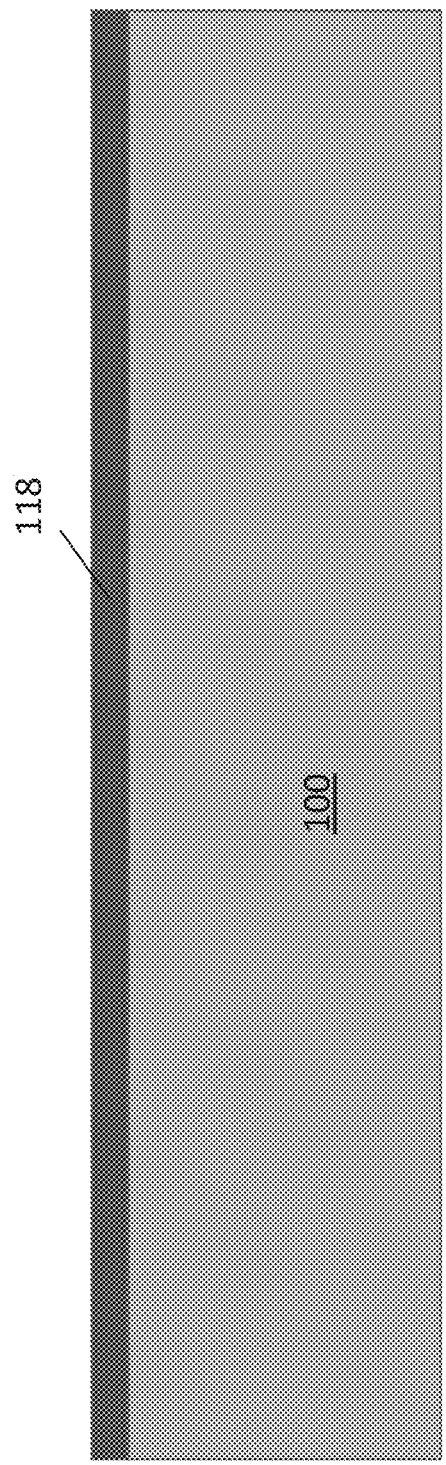
FIG. 18 illustrates providing a semiconductor body and forming a nitride layer on the semiconductor body, according to an embodiment.

Referring to FIG. 18, a semiconductor body 100 as described with reference to FIG. 1 has been provided. After providing the substrate, a nitride layer 118 is formed on the the first surface 102. The nitride layer 118 may be formed by a deposition process, for example. The material of the nitride layer 118 may be any material that is resistant to high temperatures, such as a nitrogen oxide or a silicon nitride.

Figure 19:
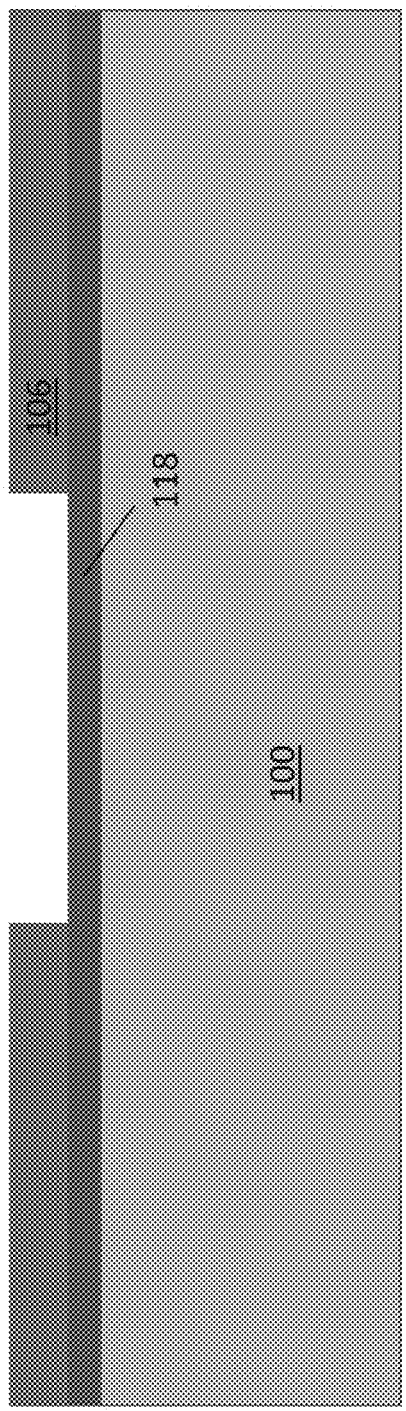
FIG. 19 illustrates forming a patterned first photoresistive layer on the nitride layer, according to an embodiment.

Referring to FIG. 19, a patterned first photoresistive layer 106 is formed on the nitride layer 118. The patterned first photoresistive layer 106 can be formed in the manner described with reference to FIG. 2., for example.

Figure 20:
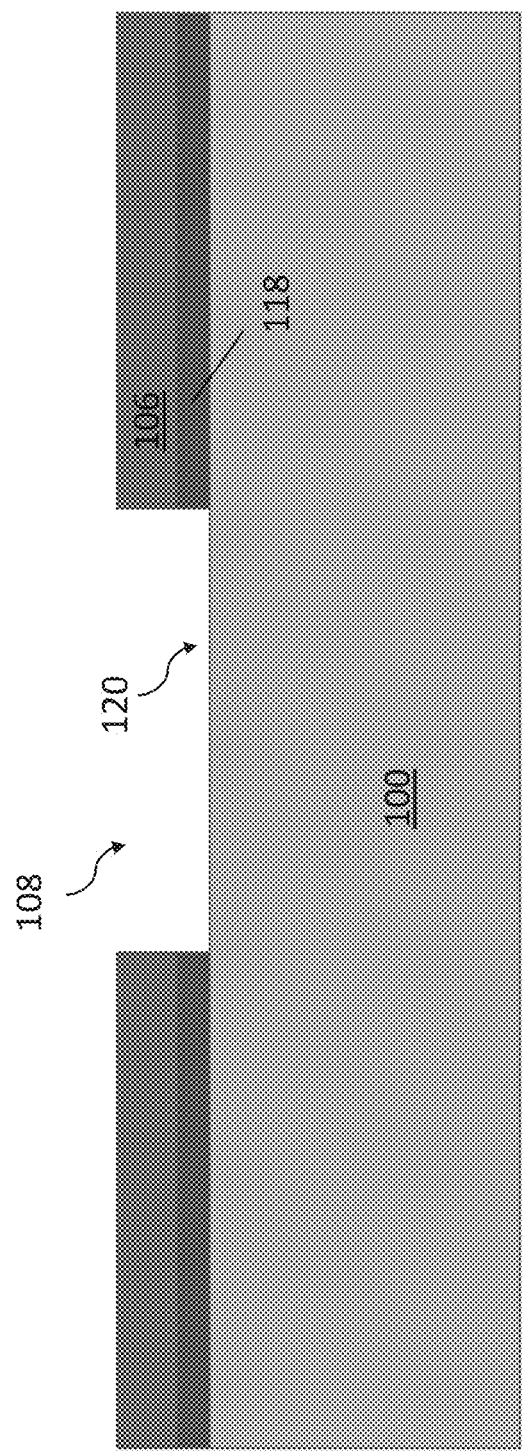
FIG. 20 illustrates removing a portion of the nitride using the patterned first photoresistive layer as an etch mask, according to an embodiment.

Referring to FIG. 20, an opening 120 is formed in the nitride layer 118. The opening 120 may be formed by using the patterned first photoresistive layer 106 as a mask for a dry chemical etch, for example. As a result, the patterned first photoresistive layer 106 and the nitride layer 118 each have openings with substantially identical lateral geometry.

Figure 21:
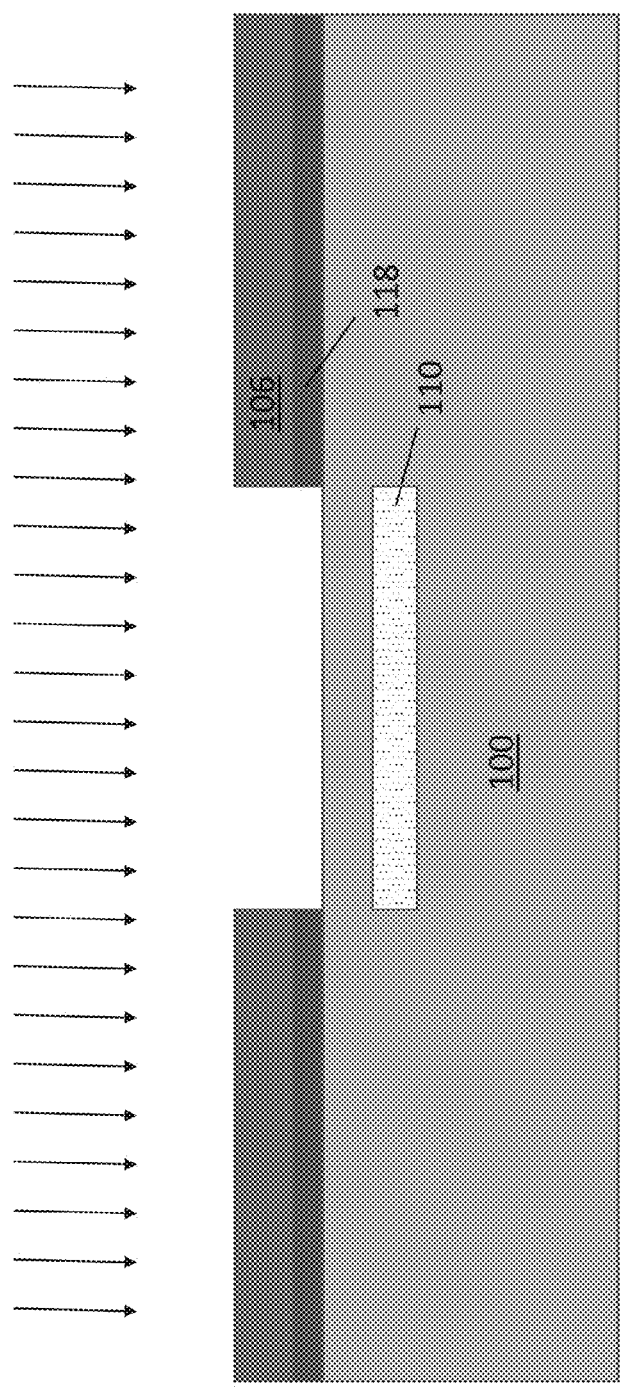
FIG. 21 illustrates masked implantation of dopant atoms through openings in the first photoresistive layer and the nitride layer into a discrete deep region of the semiconductor body, according to an embodiment.

Referring to FIG. 21, dopant atoms are implanted through the openings 108, 120 in the patterned first photoresistive layer 106 and the nitride layer 118 into the semiconductor body 100. The dopant atoms may be implanted in the manner described with reference to FIG. 3, for example. The patterned first photoresistive layer 106 acts as a mask preventing the dopant atoms from penetrating the semiconductor body 100 in these regions. As a result, a structured deep doped region 110 is formed in the semiconductor body 100, wherein the lateral area of the openings 108, 120 in the patterned first photoresistive layer 106 and the patterned nitride layer 118 corresponds to the lateral area of the deep doped region 110.

Figure 22:
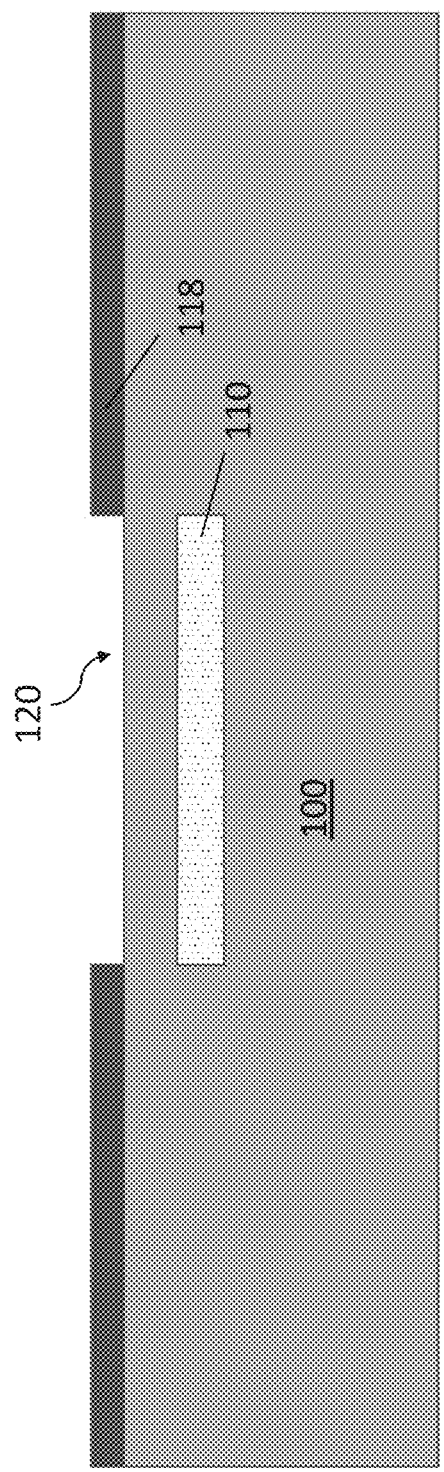
FIG. 22 illustrates removing the first photoresistive layer, according to an embodiment.

Referring to FIG. 22, the patterned first photoresistive layer 106 is removed, while the patterned nitride layer 118 remains on the semiconductor body 100. This may be done by a chemical etching technique, for example.

Figure 23:
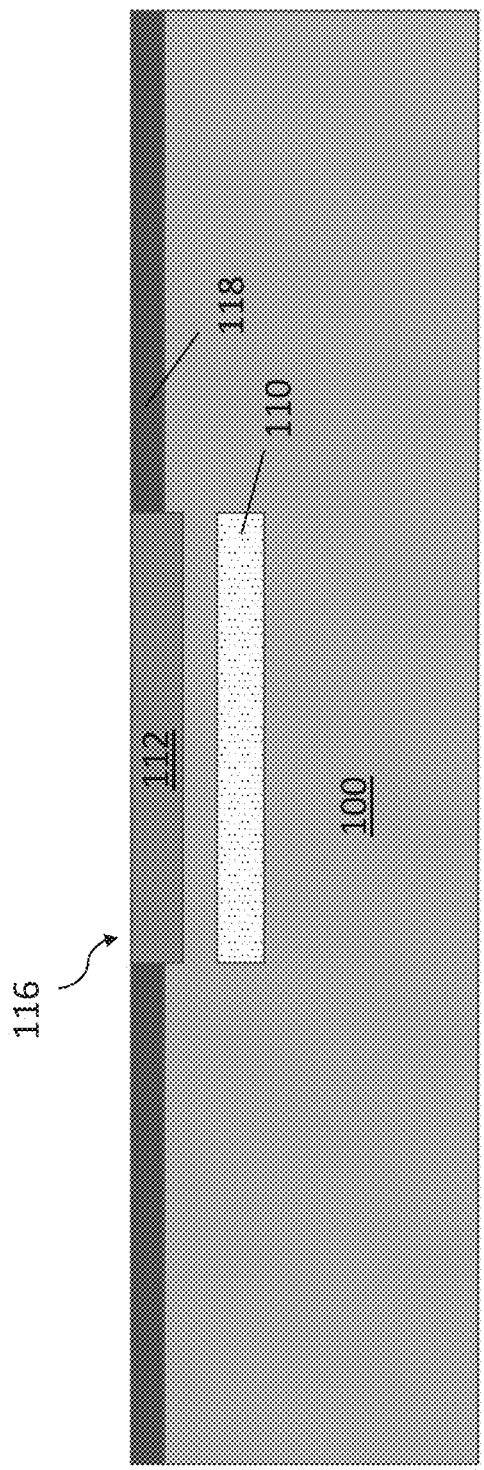
FIG. 23 illustrates forming a structured anti-reflective coating region in the opening of the nitride layer using a local oxidation of silicon technique, according to an embodiment.

Referring to FIG. 23, an oxidation process is performed so as to oxidize a portion of the semiconductor body 100 that is exposed from the nitride layer 118. This may be done using a local oxidation of silicon (LOCOS) technique for example. According to this technique, the semiconductor body 100 is annealed at a high temperature (e.g., between 800° C. and 1200° C.) in an oxygen rich environment. Thermal oxidation occurs whereby some of the semiconductor material is consumed by a semiconductor oxide, e.g., $SiO_2$. The patterned nitride layer 118 prevents the semiconductor oxide from forming in the regions that are covered by the nitride. As a result, a structured oxide region that extends into the semiconductor body 100 forms in the opening of the nitride layer 118. This oxide can be an antireflective oxide. Thus, the LOCOS technique is used to produce a structured anti-reflective coating region 116.

Figure 24:
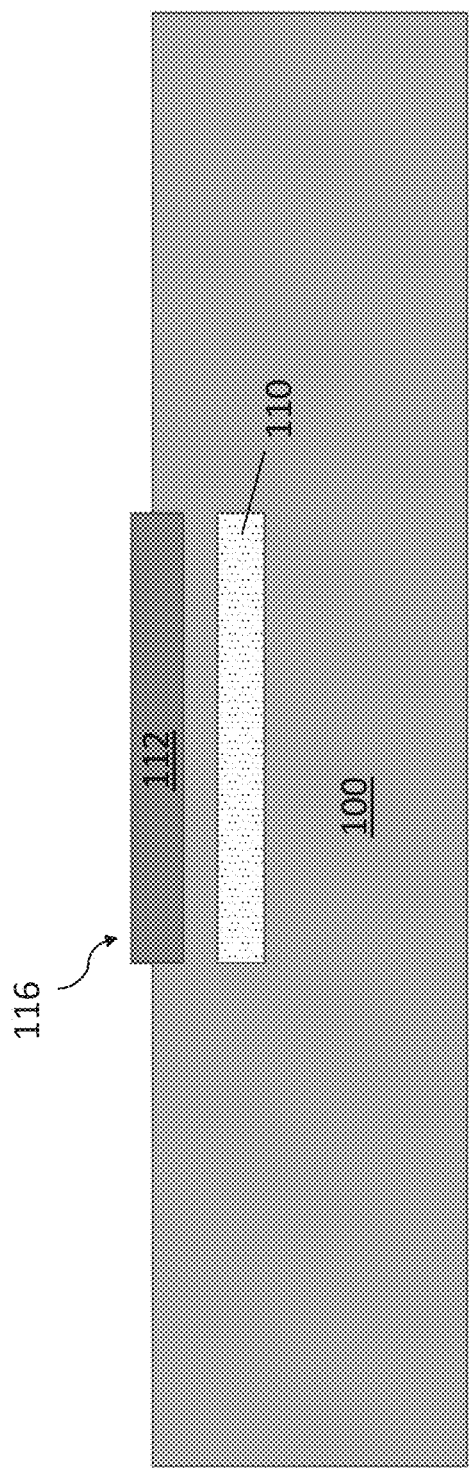
FIG. 24 illustrates removing the nitride layer from the semiconductor body, according to an embodiment.

Referring to FIG. 24, the patterned nitride layer 118 is removed from the semiconductor body 100. This may be done by a wet chemical etching technique, for example. Thus, a device that substantially corresponds to the device depicted in FIG. 7 is produced. In this case, the structured anti-reflective coating region 116 is partially disposed below the first surface 102 and thus the device differs slightly from the previously discussed embodiments in which the structured anti-reflective coating region 116 is formed on the first surface 102. Subsequently, the laser thermal annealing described with reference to FIG. 8 may be performed in a similar or identical manner to activate the dopant atoms in the deep doped region 110. The energy of the laser thermal annealing may be adjusted in comparison to the previous embodiments to account for the different depth of the structured anti-reflective coating region 116.

Figure 25:
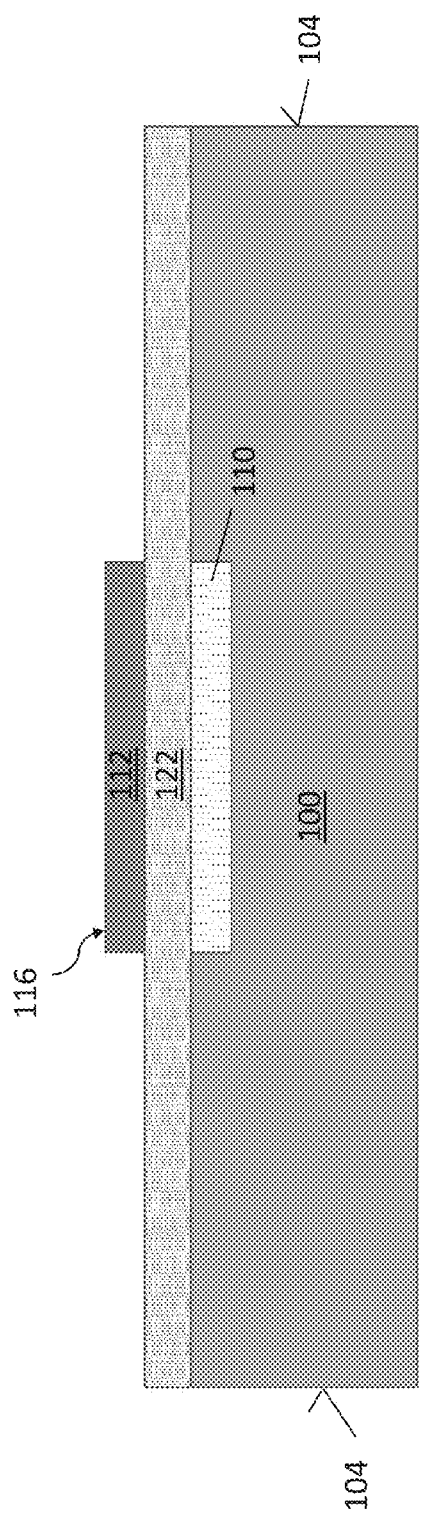
FIG. 25 illustrates forming a non-structured shallow doped layer in a substrate with a structured anti-reflective coating region and a buried doped region with non-active dopant atoms, according to an embodiment.
Figure 26:
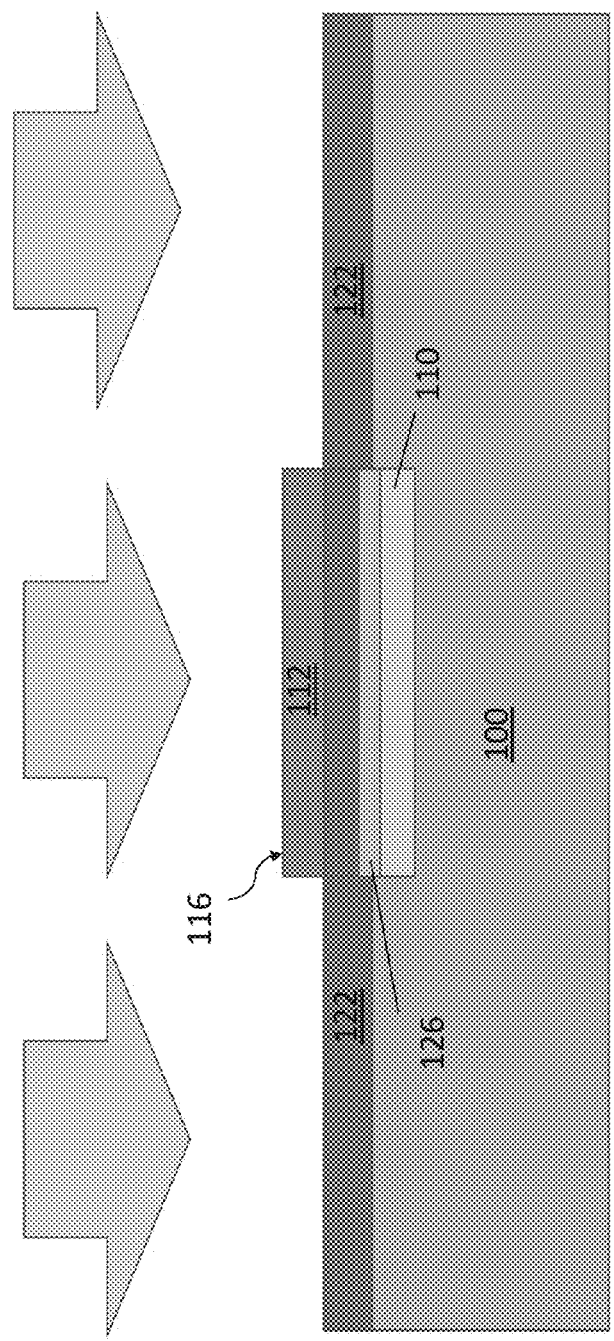
FIG. 26 illustrates activating dopant atoms in the non-structured shallow doped layer and the buried doped region using a laser thermal anneal, according to an embodiment.

Referring to FIGS. 25-26, an example of a method that combines any one of the previously described embodiments with a non-structured dopant implant step is depicted, according to an embodiment.

Referring to FIG. 25, a semiconductor body 100 that includes the structured anti-reflective coating region 116 and the deep doped region 110 before dopant activation is provided. These features may be formed according to any one of the techniques described herein. Before the dopants in the deep doped region 110 are activated, a shallow doped region 122 is formed in the semiconductor body 100. The shallow doped region 122 may be wider than the deep doped region 110. The shallow doped region 122 may be completely unstructured in that it forms a complete layer spanning between the edge sides 104 of the semiconductor body 100. Alternatively, the shallow doped region 122 could be a discrete doped region that is formed in a portion of the semiconductor body 100. The shallow doped region 122 includes inactive dopant atoms that are implanted in the semiconductor body 100. The species of dopant atoms in the shallow doped region 122 may be the same species of dopant atoms in the deep doped region 110. According to another embodiment, the shallow doped region 122 has different dopant atom species as the deep doped region 110. The shallow doped region 122 extends from the first surface 102 of the semiconductor body 100 to a depth that is less than a depth of the bottom of the deep doped region 110. According to one embodiment, the bottom of the shallow doped region 122 corresponds is parallel with the top of the deep doped region 110. The shallow doped region 122 may be formed before or after the deep doped region 110.

Referring to FIG. 26, a laser thermal anneal is applied to the semiconductor body 100. This may be done in the manner described with reference to FIG. 8. In this case, the laser thermal anneal activates the dopant atoms in both the shallow doped region 122 and the deep doped region 110. In the areas outside of the structured anti-reflective coating region 116, the energy from the laser is sufficient to activate all of the dopant atoms up to the bottom of the shallow doped region 122. Directly below the structured anti-reflective coating region 116, the anti-reflective properties of the anti-reflective coating direct significantly more energy from the laser into the semiconductor body 100, thereby activating all or nearly all of the dopant atoms in the deep doped region 110. Because the laser thermal anneal melts the semiconductor material in both the shallow doped region 122 and the deep doped region 110, intermixing of the dopant atoms from the deep doped region 110 and the shallow doped region 122 is possible. In the figure, an intermediate region 123 that is located at an interface between the deep doped region 110 and the shallow doped region 122 denotes a region where intermixing of the dopant atoms is likely to occur.

Figure 27:
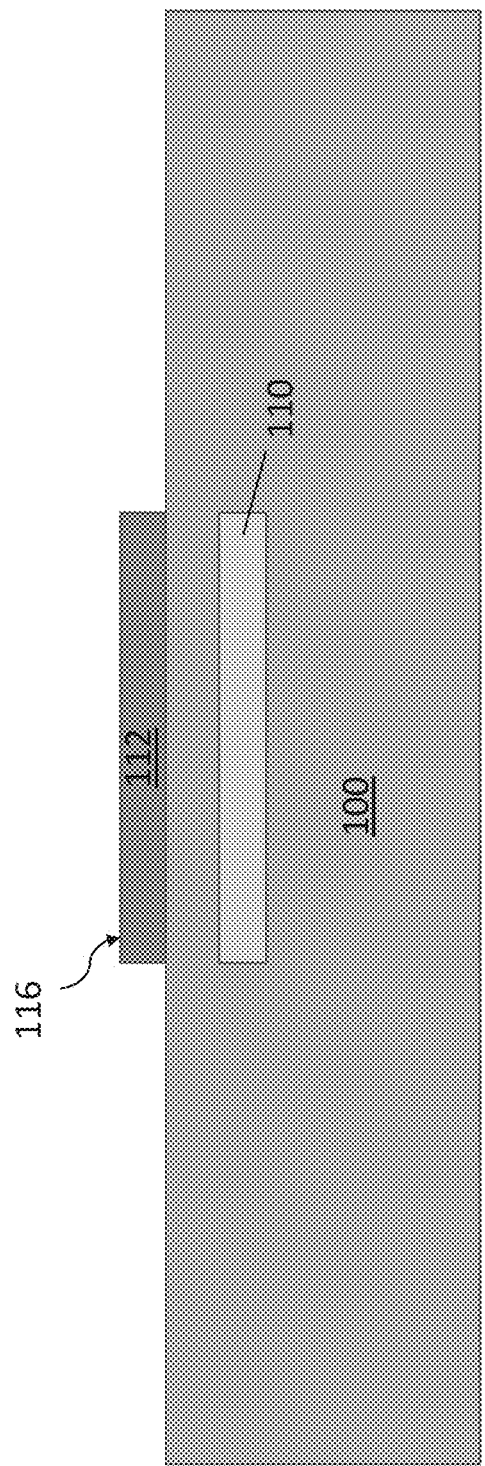
FIG. 27 illustrates providing a semiconductor body with a structured anti-reflective coating region and a buried doped region with activated dopant atoms, according to an embodiment.
Figure 28:
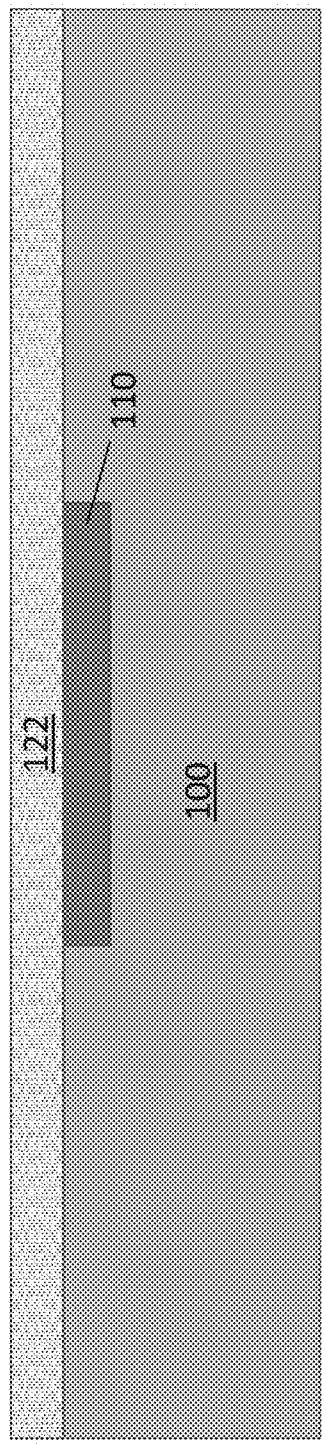
FIG. 28 illustrates removing the structured anti-reflective coating region and forming a non-structured shallow doped layer with non-active dopant atoms, according to an embodiment.
Figure 29:
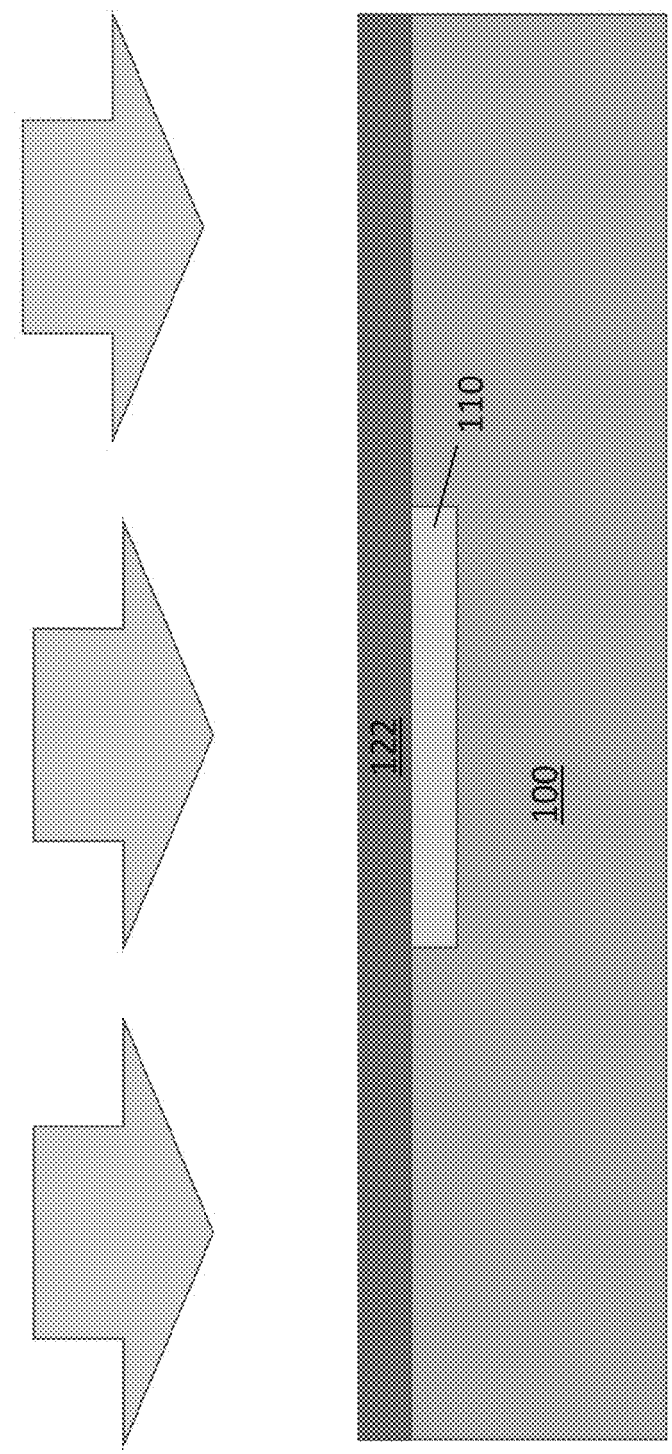
FIG. 29 illustrates activating dopant atoms in the non-structured shallow doped layer, according to an embodiment.

Referring to FIGS. 27-29, an example of a method that combines any one of the previously described embodiments with a non-structured dopant implant step is depicted, according to another embodiment.

Referring to FIG. 27, a semiconductor body 100 that includes the structured anti-reflective coating region 116 and the deep doped region 110 after dopant activation is provided. These features may be formed according to any one of the techniques described herein.

Referring to FIG. 28, the structured anti-reflective coating region 116 has been removed. This may be done by a chemical etch, for example. In addition, the shallow doped region 122 as described with reference to FIG. 25 is formed. Thus, the semiconductor body 100 includes a region with inactive dopant atoms (the shallow doped region 122) and a region with active dopant atoms (the deep doped region 110).

Referring to FIG. 29, a laser thermal anneal is applied to the semiconductor body 100. This may be done in the manner described with reference to FIG. 8. As a result, the dopant atoms in the shallow doped region 122 are activated. In this case, intermixing of the dopant atoms between the shallow doped region 122 and the deep doped region 110 is avoided, as the laser thermal anneal only energizes a shallow region of the semiconductor body 100, and does not substantially impact the deep doped region 110.

Figure 30:
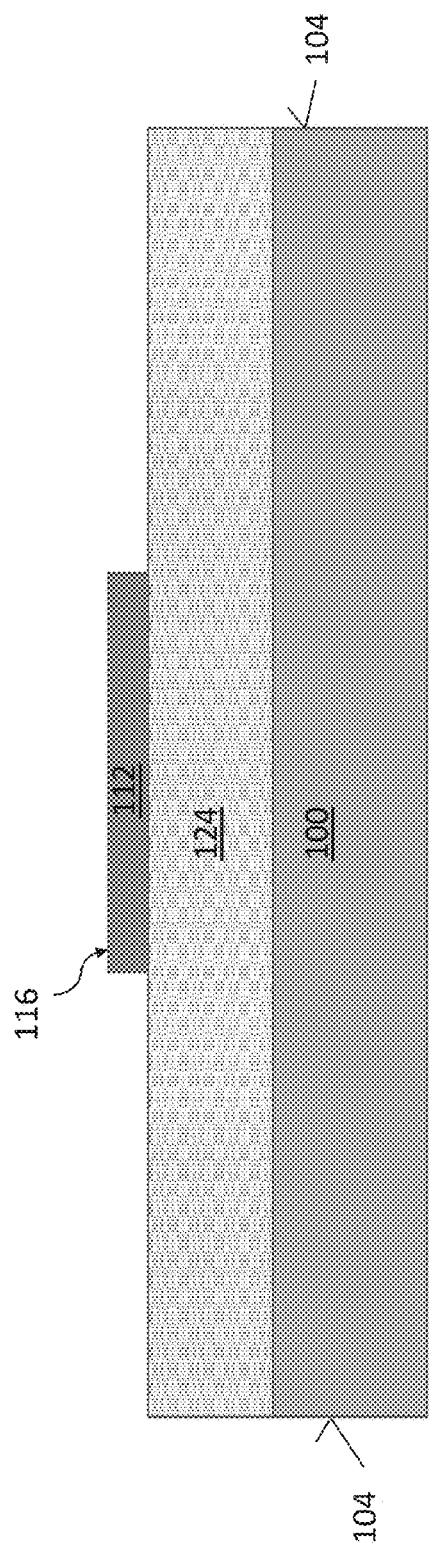
FIG. 30 illustrates forming a non-structured doped layer with non-active dopant atoms and a structured anti-reflective coating region, according to an embodiment.
Figure 31:
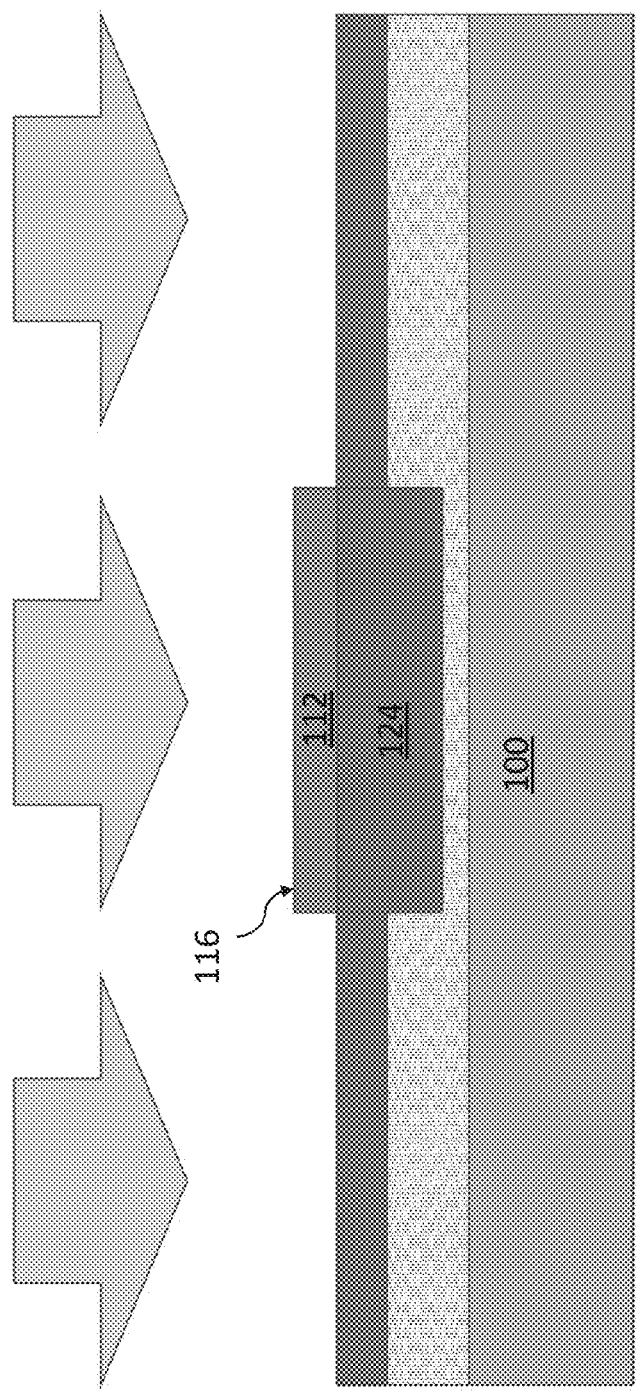
FIG. 31 illustrates activating dopant atoms in the non-structured doped layer using a laser thermal anneal, according to an embodiment.

Referring to FIGS. 30-31, an example of a method that combines any one of the previously described embodiments with a non-structured dopant implant step is depicted, according to another embodiment.

Referring to FIG. 30, a semiconductor body 100 that includes the structured anti-reflective coating region 116 is provided. The structured anti-reflective coating region 116 may be formed according to any one of the techniques described herein. In this case, no deep doped region 110 has been formed in the semiconductor body 100. Instead, a deep doped layer 124 that extends from the first surface 102 into the semiconductor body 100 is formed. The deep doped layer 124 may be completely unstructured in that it forms a complete layer spanning between the edge sides 104 of the semiconductor body 100. Alternatively, the deep doped layer 124 could be a discrete region that is formed in a portion of the semiconductor body 100. The deep doped layer 124 includes inactive dopant atoms that are implanted deeply into the semiconductor body 100. For example, the deep doped layer 124 may extend at least 400 nm beneath the first surface 102, and may extend 1000 nm or more. The deep doped layer 124 may be formed before or after the structured anti-reflective coating region 116 is formed.

Referring to FIG. 31, a laser thermal anneal is applied to the semiconductor body 100. This may be done in the manner described with reference to FIG. 8. The laser is directed through the structured anti-reflective coating and is also directed into the semiconductor body 100 in regions that are laterally adjacent to the structured anti-reflective coating. The anti-reflective properties of the structured anti-reflective coating region 116 cause dopant activation at a greater depth in regions of the deep doped layer 124 that are directly beneath the structured anti-reflective coating than in regions that are laterally adjacent to the structured anti-reflective coating. In this way, the structured anti-reflective coating region 116 can be used to locally form a more deeply doped portion in a selected region of the deep doped layer 124.

Figure 32:
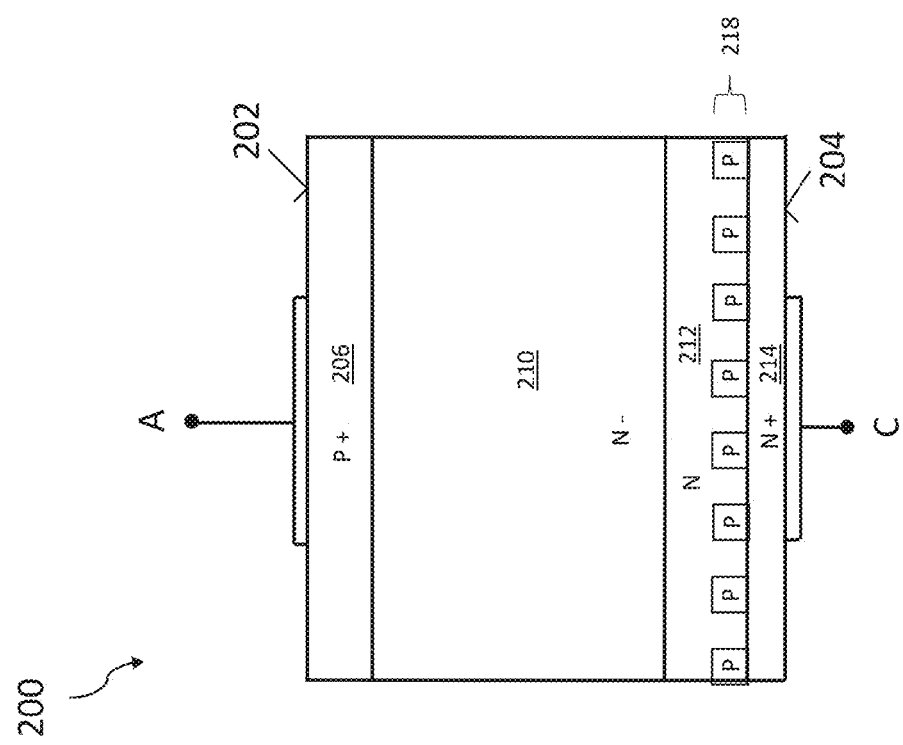
FIG. 32 illustrates a vertical semiconductor device with a plurality of doped regions that are formed using a structured anti-reflective coating region and a laser thermal anneal technique, according to an embodiment.

Referring to FIG. 32, an exemplary semiconductor device 200 that includes a plurality of deep doped regions 110 formed according to the techniques described herein is depicted. The semiconductor device 200 is a vertical semiconductor device. That is, the semiconductor device is configured to conduct in a vertical direction between a main surface 202 of a semiconductor substrate and a rear surface 204 of the substrate that is vertically spaced apart from the main surface 202. In the embodiment of FIG. 32, the device 200 is configured a vertical diode. The device 200 includes a second conductivity type region 206 that extends to the main surface 202 and electrically connects to an anode (A) electrode. The device 200 further includes a first conductivity type region 214 that extends to the rear surface 204 and electrically connects to a cathode (C) electrode. The device 200 further includes a first conductivity type drift region 210 and a first conductivity type field stop region 212 that is more highly doped region than the drift region 210, wherein both the drift region 210 and the field stop region 212 are disposed between the second conductivity type region 206 and the first conductivity type region 214. The device 200 further includes a structured second conductivity type region 218 that is disposed in the current path of the device, and more specifically within the field stop region 212. In a commonly known manner, the device is configured to allow or block a current flowing between the anode (A) and the cathode (C), depending on the biasing of the p-n junction between the second conductivity type region 206 and the drift region 210. Advantages of the structured second conductivity type region 218 include improved commutation softness. The diode depicted in FIG. 32 is just one example of a device type that could include a second conductivity type region 218. Alternatively, the device 200 can be configured as a vertical MOSFET by the incorporation of a gate structure and a first conductivity type source region at the main surface 202, for example. According to another embodiment, the device 200 can be configured as an IGBT by providing the vertical MOSFET structure described above and by including a second conductivity type collector region at the rear surface 204, for example.

The second conductivity type region 218 can be formed by forming a plurality of the deep doped regions 110 according to the techniques described herein. For example, the techniques described herein can be used as part of a rear side wafer process, wherein the rear surface 204 corresponds to the first surface 102 referred to in the previous embodiments.

Advantageously, the methods described herein allow for the formation of the structured second conductivity type region 218 in the device of FIG. 32 at significantly greater distance from the rear surface 204 with higher dopant activation and greater efficiency than would otherwise be possible without use of a structured antireflective coating. Using conventional laser annealing techniques to activate the p-type doped regions limits the thickness of the region disposed between the second conductivity type region 218 and the rear surface 204 of the device 200 because, as previously explained, conventional laser annealing techniques have limited effectiveness beyond certain depths. For example, the thickness of the first conductivity type region 214 could be limited to 200 nm. This is because forming the first conductivity type region 214 to 200 nm places the second conductivity type region 218 beyond the activation range of the laser thermal annealing tool when no antireflective coating is present on the rear surface 204. In the case of a diode structure, this makes emitter of the device sensitive to spiking and defect density and limits the possible activated dopant dose. The techniques described herein allow for first conductivity type region 214 to be thicker (e.g., 200 nm or greater) and thus avoid spiking and defect density of the emitter while simultaneously allowing for the formation and activation of dopant atoms in the second conductivity type region 218.

The present specification refers to a "first" and a "second" conductivity type of dopants, semiconductor portions are doped with. The first conductivity type may be n type and the second conductivity type may be p type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. This principle also applies to bipolar transistors in general and specifically to insulated gate bipolar transistors. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending on whether the first conductivity type means n-type or p-type.

The terms "wafer," "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The terms "lateral" and "horizontal" as used in this specification intends to describe an orientation parallel to a first surface 102 of a semiconductor substrate or semiconductor body 100. This can be for instance the surface of a wafer or a die.

The term "vertical" as used in this specification intends to describe an orientation which is arranged perpendicular to the first surface 102 of the semiconductor substrate or semiconductor body 100.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

The description of the embodiments is not limiting. In particular, elements of the embodiments described hereinafter may be combined with elements of different embodiments.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of forming a semiconductor device, the method comprising:
   providing a semiconductor body comprising a first surface;
   forming a deep doped region of the semiconductor body by using masked ion implantation to implant dopant atoms into a discrete region within the semiconductor body;
   forming a structured anti-reflective coating region on a portion of the first surface that is aligned with the deep doped region in a lateral direction of the semiconductor body, the lateral direction being parallel to the first surface; and
   performing a laser thermal anneal of the deep doped region of the semiconductor body through the anti-reflective coating region thereby activating the implanted dopant atoms in the deep doped region.

2. The method of claim 1, wherein the structured anti-reflective coating region is formed to completely overlap with the deep doped region in the lateral direction of the semiconductor body.

3. The method of claim 2, wherein a lateral area of the structured anti-reflective coating region substantially corresponds to a lateral area of the deep doped region.

4. The method of claim 3, wherein the discrete region within the semiconductor body is spaced apart from the first surface and surrounded by portions of the semiconductor body that are devoid of the implanted dopant atoms.

5. The method of claim 1, wherein forming the deep doped region comprises forming a patterned first photoresistive layer on the first surface, wherein forming the structured anti-reflective coating region comprises forming a patterned second photoresistive layer on the first surface, the patterned second photoresistive layer having an inverse geometry as the patterned first photoresistive layer.

6. The method of claim 5, wherein the patterned first photoresistive layer has an opposite polarity as the patterned second photoresistive layer, and wherein the patterned first photoresistive layer and the patterned second photoresistive layer are formed using a common photomask.

7. The method of claim 5,
   wherein forming the deep doped region comprises:
      forming the patterned first photoresistive layer directly on the first surface with an opening having a lateral area corresponding to a lateral area of the deep doped region;
      implanting dopant atoms through the opening, and
   wherein forming the structured anti-reflective coating region comprises:
      forming a layer of the anti-reflective coating directly on the first surface;
      forming the patterned second photoresistive layer on the anti-reflective coating, the patterned second photoresistive layer having an inverse geometry as the patterned first photoresistive layer; and
      removing portions of the anti-reflective coating layer that are exposed from the patterned second photoresistive layer.

8. The method of claim 7, wherein the patterned first photoresistive layer before the layer of the anti-reflective coating and the patterned second photoresistive layer are formed, wherein the patterned first photoresistive layer is removed from the first surface after implanting the dopant atoms, and wherein the layer of the anti-reflective coating and the patterned second photoresistive layer are formed after removing the patterned first photoresistive layer.

9. The method of claim 7, wherein the layer of the anti-reflective coating is formed and the patterned second photoresistive layer is formed before the first photoresistive layer is formed, and wherein the patterned first photoresistive layer is formed around the structured anti-reflective coating region after removing the portions of the anti-reflective coating layer that are exposed from the patterned second photoresistive layer.

10. The method of claim 1, wherein forming the deep doped region and forming the structured anti-reflective coating region comprises forming a patterned first photoresistive layer on the first surface and using a geometry of the patterned first photoresistive layer to define lateral boundaries of both the deep doped region and the structured anti-reflective coating region.

11. The method of claim 10,
    wherein forming the deep doped region comprises:
       forming the patterned first photoresistive layer directly on the first surface, the patterned first photoresistive layer having opening having a lateral area corresponding to a lateral area of the deep doped region;
       implanting dopant atoms through the opening, and
    wherein forming the structured anti-reflective coating region comprises:
       depositing a layer of the anti-reflective coating with the patterned first photoresistive layer being present on the first surface thereby filling the opening with the anti-reflective coating and covering the patterned first photoresistive layer with the anti-reflective coating.

12. The method of claim 11, further comprising:
    removing the patterned first photoresistive layer and the anti-reflective coating that covers the patterned first photoresistive layer using a lift-off technique whereby the patterned first photoresistive layer is etched selective to the semiconductor body,
    wherein only the structured anti-reflective coating region remains on the first surface of the semiconductor body after performing the lift-off technique.

13. The method of claim 10, further comprising depositing a nitride layer on the first surface before forming the deep doped region and forming the structured anti-reflective coating region,
    wherein forming the deep doped region comprises:
       forming a first photoresistive layer on the nitride layer;
       patterning the first photoresistive layer and the nitride layer each with an opening having a lateral area corresponding to a lateral area of the deep doped region; and
       implanting dopant atoms through the openings in the first photoresistive layer and the nitride layer, wherein the patterned first photoresistive layer is removed after implanting the dopant atoms, and wherein forming the structured anti-reflective coating region comprises, after removing the patterned first photoresistive layer:

locally oxidizing the semiconductor body at the first surface within the opening of the nitride layer, wherein the patterned nitride layer prevents adjacent portions of the semiconductor body that surround the opening from oxidizing during the locally oxidizing of the semiconductor body.

14. The method of claim 1, further comprising:

forming a shallow doped region in the semiconductor body before performing the laser thermal anneal by implanting dopant atoms into the semiconductor body, the shallow doped region being wider than the deep doped region and being disposed between the deep doped region and the first surface; and activating dopant atoms in both the deep doped region and the shallow doped region during the laser thermal anneal.

15. The method of claim 1, further comprising:

removing the structured anti-reflective coating region after performing the laser thermal anneal;

forming a shallow doped region in the semiconductor body after removing the structured anti-reflective coating by implanting dopant atoms into the semiconductor body, the shallow doped region being wider than the deep doped region and being disposed between the deep doped region and the first surface, activating dopant atoms in the shallow doped region by performing a second laser thermal anneal.

16. A method of forming a semiconductor device, the method comprising:

providing a semiconductor body comprising a first surface;

providing a laser thermal annealing tool that is configured to locally anneal a portion of the semiconductor body beneath the first surface;

forming a deep doped region in a portion of the semiconductor body that is beyond a dopant activation range of the laser thermal annealing tool;

forming a structured anti-reflective coating region on a portion of the first surface; and performing a laser thermal anneal of the deep doped region of the semiconductor body through the anti-reflective coating region using the laser thermal annealing tool thereby activating the dopant atoms in the deep doped region.

17. The method of claim 16, wherein the deep doped region is formed in a portion of the semiconductor body that is between 400 nanometers and 1000 nanometers away from the first surface, and wherein performing the laser thermal anneal through the anti-reflective coating region activates substantially all of the dopant atoms in the deep doped region.

18. The method of claim 16, wherein the semiconductor device is configured to vertically conduct between a main surface and a rear surface of the semiconductor body that is vertically spaced apart from the main surface, wherein forming the semiconductor device comprises:

forming a plurality of the deep doped regions in a vertical conduction path of the semiconductor device, wherein the deep doped regions are laterally spaced apart from one another.

19. The method of claim 18, wherein the semiconductor device comprises a first conductivity type emitter region extending to the rear surface of the semiconductor body and a first conductivity type field stop region with a lower majority carrier concentration than the emitter region directly adjoining the emitter region and spaced apart from the main surface, wherein the each of the deep doped regions in the plurality is formed in the field stop region, and wherein a thickness of the emitter region is greater a dopant activation range of the laser thermal annealing tool.

20. A method of forming a semiconductor device, the method comprising:

providing a semiconductor body comprising a first surface;

forming a doped layer that extends from the first surface into the semiconductor body by implanting dopant atoms into the semiconductor body;

forming a structured anti-reflective coating region on the first surface over a portion of the doped layer; and performing a laser thermal anneal through the structured anti-reflective coating and outside of the structured anti-reflective coating thereby activating the implanted dopant atoms directly below the structured anti-reflective coating as well as the implanted dopant atoms that are laterally adjacent to the structured anti-reflective coating;

wherein the laser thermal anneal activates the implanted dopant atoms directly below the structured anti-reflective coating at a greater depth from the first surface than the implanted dopant atoms that are laterally adjacent to the structured anti-reflective coating.

* * * * *

UNITED STATES PATENT AND TRADEMARK OFFICE
CERTIFICATE OF CORRECTION

Page 1 of 1

PATENT NO. : 9,558,948 B1
APPLICATION NO. : 15/171483
DATED : January 31, 2017
INVENTOR(S) : Breymesser et al.

It is certified that error appears in the above-identified patent and that said Letters Patent is hereby corrected as shown below:

In the Claims

Column 16, Line 36 Claim 11, Line 5 change "having opening" to -- having an opening --

Signed and Sealed this
Eleventh Day of April, 2017

Michelle K. Lee
*Director of the United States Patent and Trademark Office*